(12) United States Patent
Warnaar et al.

(10) Patent No.: US 11,181,828 B2
(45) Date of Patent: Nov. 23, 2021

(54) METHOD OF DETERMINING A VALUE OF A PARAMETER OF INTEREST OF A PATTERNING PROCESS, DEVICE MANUFACTURING METHOD

(71) Applicant: ASML NETHERLANDS B.V., Veldhoven (NL)

(72) Inventors: Patrick Warnaar, Tilburg (NL); Hilko Dirk Bos, Utrecht (NL); Hendrik Jan Hidde Smilde, Veldhoven (NL); Mohammadreza Hajiahmadi, Rotterdam (NL); Lukasz Jerzy Macht, Veldhoven (NL); Karel Hendrik Wouter Van Den Bos, Oss (NL); Sergei Sokolov, Utrecht (NL); Lucas Tijn Kunneman, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 23 days.

(21) Appl. No.: 16/601,778

(22) Filed: Oct. 15, 2019

(65) Prior Publication Data

US 2020/0133140 A1    Apr. 30, 2020

(30) Foreign Application Priority Data

Oct. 31, 2018    (EP) .................................... 18203837

(51) Int. Cl.
*G03F 7/20* (2006.01)
*G01N 21/95* (2006.01)
(Continued)

(52) U.S. Cl.
CPC ......... *G03F 7/70516* (2013.01); *G01N 21/21* (2013.01); *G01N 21/4788* (2013.01);
(Continued)

(58) Field of Classification Search
CPC ............... G03F 7/70516; G03F 7/7065; G03F 7/70616; G03F 7/70641; G03F 7/70633;
(Continued)

(56) References Cited

U.S. PATENT DOCUMENTS 7,656,528 B2   2/2010   Abdulhalim et al.
8,867,020 B2   10/2014  Smilde et al.
(Continued)

FOREIGN PATENT DOCUMENTS

TW    201506553    2/2015
WO    2009078708   6/2009
(Continued)

OTHER PUBLICATIONS

International Search Report and Written Opinion issued in corresponding PCT Patent Application No. PCT/EP2019/077463, dated Nov. 18, 2019.

(Continued)

*Primary Examiner* — Sang H Nguyen
(74) *Attorney, Agent, or Firm* — Pillsbury Winthrop Shaw Pittman LLP

(57) ABSTRACT

Techniques for determining a value of a parameter of interest of a patterning process are described. One such technique involves obtaining a plurality of calibration data units from one or more targets in a metrology process. Each calibration data unit of at least two of the calibration data units represents detected radiation obtained using different respective polarization settings in the metrology process, each polarization setting defining a polarization property of incident radiation of the metrology process and of detected radiation of the metrology process. The calibration data units are used to obtain calibration information about the metrology process. A measurement data unit representing detected radiation scattered from a further target is obtained, the (Continued)

further target having a structure formed using the patterning process on the substrate or on a further substrate. A value of the parameter of interest is determined using the measurement data unit and the obtained calibration information.

20 Claims, 12 Drawing Sheets

(51) Int. Cl.
  *G01N 21/47* (2006.01)
  *G01N 21/21* (2006.01)
(52) U.S. Cl.
  CPC ....... *G01N 21/9501* (2013.01); *G03F 7/7065* (2013.01); *G03F 7/70625* (2013.01); *G03F 7/70633* (2013.01); *G03F 7/70641* (2013.01)
(58) Field of Classification Search
  CPC ............ G03F 7/70625; G01N 21/4788; G01N 21/21; G01N 21/9501; H01L 22/12
  See application file for complete search history.

(56) References Cited

U.S. PATENT DOCUMENTS

| | | | |
|---|---|---|---|
| 9,786,044 B2 | 10/2017 | Fuchs et al. | |
| 2003/0206298 A1 | 11/2003 | Bischoff et al. | |
| 2004/0190008 A1* | 9/2004 | Mieher | G01N 21/95607 356/625 |
| 2006/0033921 A1 | 2/2006 | Den Boef et al. | |
| 2006/0066855 A1 | 3/2006 | Den Boef et al. | |
| 2007/0222979 A1* | 9/2007 | Van Der Laan | G03F 7/705 356/243.1 |
| 2010/0201963 A1 | 8/2010 | Cramer et al. | |
| 2011/0027704 A1 | 2/2011 | Cramer et al. | |
| 2011/0043791 A1 | 2/2011 | Smilde et al. | |
| 2012/0044495 A1 | 2/2012 | Straaijer | |
| 2012/0123581 A1* | 5/2012 | Smilde | G03F 7/70641 700/105 |
| 2012/0242970 A1 | 9/2012 | Smilde et al. | |
| 2016/0116849 A1* | 4/2016 | Cramer | G03F 7/70683 355/67 |
| 2017/0255737 A1 | 9/2017 | Van Leest et al. | |
| 2018/0157180 A1* | 6/2018 | Pandey | G03F 7/70633 |

FOREIGN PATENT DOCUMENTS

| | | |
|---|---|---|
| WO | 2009106279 | 9/2009 |
| WO | 2010069757 | 6/2010 |

OTHER PUBLICATIONS

Taiwanese Office Action issued in corresponding Taiwanese Patent Application No. 108139163, dated Jun. 11, 2020.
Extended European Search Report issued in corresponding European Patent Application No. 18203837.2, dated Jun. 25, 2019.

* cited by examiner

METHOD OF DETERMINING A VALUE OF A PARAMETER OF INTEREST OF A PATTERNING PROCESS, DEVICE MANUFACTURING METHOD

This application claims the benefit of priority of European patent application no. 18203837.2, filed Oct. 31, 2018, which is incorporated herein in its entirety by reference.

FIELD

The present description relates to obtaining a value of a parameter of interest of a patterning process, such as a patterning process that uses a lithographic apparatus as part of a device manufacturing process.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Multiple layers and/or features may be manufactured and processed using different fabrication processes, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

SUMMARY

With the advancement of lithography and other patterning process technologies, the dimensions of functional elements have continually been reduced while the amount of the functional elements, such as transistors, per device has been steadily increased over decades. In the meantime, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

According to an aspect, there is provided a method of determining a value of a parameter of interest of a patterning process, the method comprising: obtaining a plurality of calibration data units, each calibration data unit representing detected radiation scattered from a respective target in a metrology process, the target comprising a structure formed on a substrate using the patterning process, wherein each of at least two of the calibration data units represents detected radiation obtained using different respective polarization settings in the metrology process, each polarization setting defining a polarization property of incident radiation of the metrology process and a polarization property of detected radiation of the metrology process; using the calibration data units to obtain calibration information about the metrology process; obtaining a measurement data unit representing detected radiation scattered from a further target, the further target comprising a structure formed using the patterning process on the substrate or on a further substrate; and determining the value of the parameter of interest using the measurement data unit and the obtained calibration information.

According to an aspect, there is provided a method of determining a value of a parameter of interest of a patterning process, the method comprising: obtaining a pair of calibration data units, each calibration data unit representing detected radiation scattered from a target in a metrology process, the target comprising a structure formed on a substrate using the patterning process, wherein a first calibration data unit of the pair of calibration data units is obtained with the substrate at a reference angular position and a second calibration data unit of the pair of calibration data units is obtained with the substrate rotated through a certain angle away from the reference angular position; using the pair of calibration data units to obtain calibration information about the metrology process; obtaining a measurement data unit representing detected radiation scattered from a further target, the further target comprising a structure formed using the patterning process on the substrate or on a further substrate; and determining the value of the parameter of interest using the measurement data unit and the obtained calibration information.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
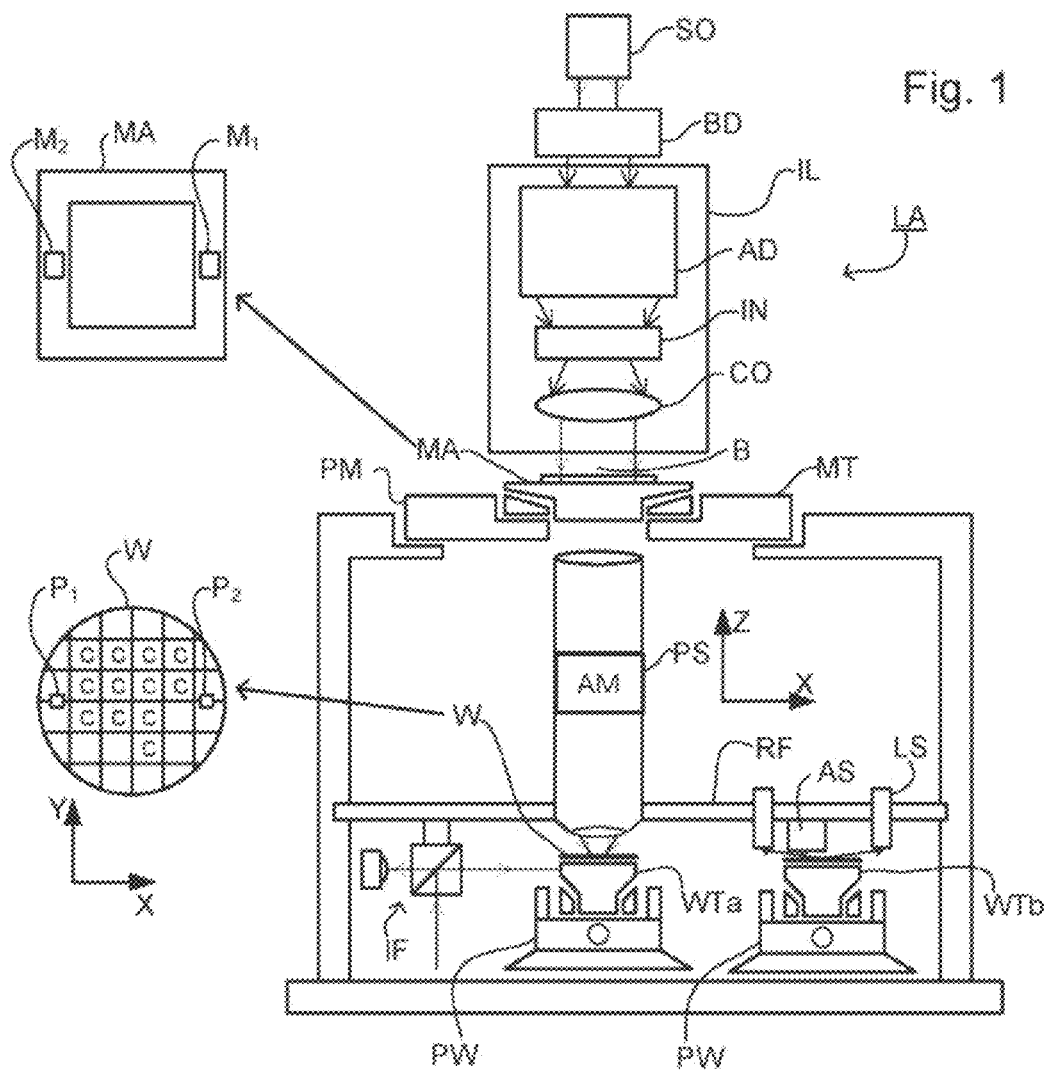
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W, the projection system supported on a reference frame (RF).

The illumination system may include various types of optical components, such as refractive, reflective, magnetic, electromagnetic, electrostatic or other types of optical components, or any combination thereof, for directing, shaping, or controlling radiation.

The support structure supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate.

An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
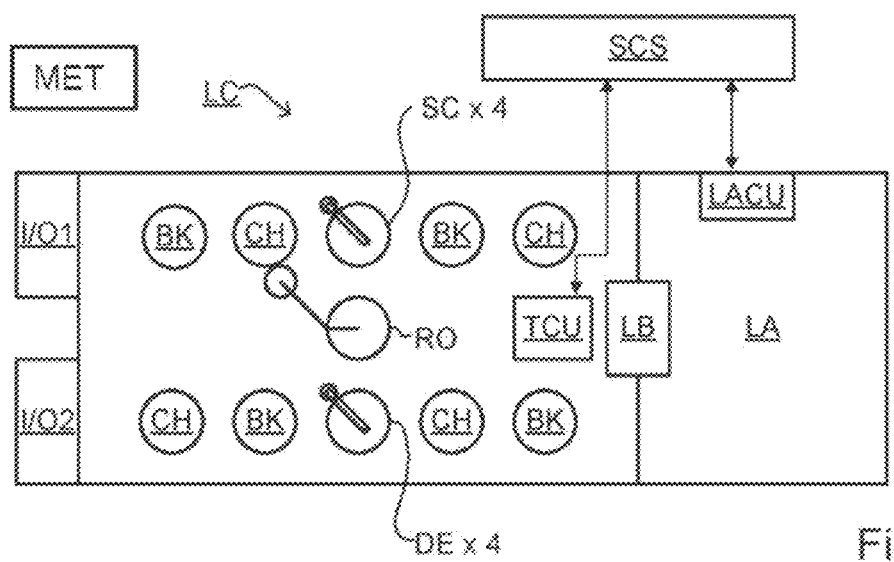
FIG. 2 schematically depicts an embodiment of a lithographic cell or cluster.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently, it is desirable to inspect an exposed substrate to measure or determine one or more properties such as overlay (which can be, for example, between structures in overlying layers or between structures in a same layer that have been provided separately to the layer by, for example, a double patterning process), line thickness, critical dimension (CD), focus offset, a material property, etc. Accordingly a manufacturing facility in which lithocell LC is located also typically includes a metrology system MET which receives some or all of the substrates W that have been processed in the lithocell. The metrology system MET may be part of the lithocell LC, for example it may be part of the lithographic apparatus LA.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which are good.

Within a metrology system MET, a metrology apparatus is used to determine one or more properties of the substrate, and in particular, how one or more properties of different substrates vary or different layers of the same substrate vary from layer to layer. The metrology apparatus may be integrated into the lithographic apparatus LA or the lithocell LC or may be a stand-alone device. To enable rapid measurement, it is desirable that the metrology apparatus measure one or more properties in the exposed resist layer immediately after the exposure. However, the latent image in the resist has a low contrast—there is only a very small difference in refractive index between the parts of the resist which have been exposed to radiation and those which have not—and not all metrology apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of a faulty substrate but may still provide useful information.

To enable the metrology, one or more targets can be provided on the substrate. In an embodiment, the target is specially designed and may comprise a periodic structure. In an embodiment, the target is a part of a device pattern, e.g., a periodic structure of the device pattern. In an embodiment, the device pattern is a periodic structure of a memory device (e.g., a Bipolar Transistor (BPT), a Bit Line Contact (BLC), etc. structure).

In an embodiment, the target on a substrate may comprise one or more 1-D periodic structures (e.g., gratings), which are printed such that after development the periodic structural features are formed of solid resist lines. In an embodiment, the target may comprise one or more 2-D periodic structures (e.g., gratings), which are printed such that after development the one or more periodic structures are formed of solid resist pillars or vias in the resist. The bars, pillars or vias may alternatively be etched into the substrate (e.g., into one or more layers on the substrate).

In an embodiment, one of the parameters of interest of a patterning process is overlay. Overlay can be measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by device product structures on a substrate. In an embodiment, multiple targets can be measured in one radiation capture.

Figure 3A:
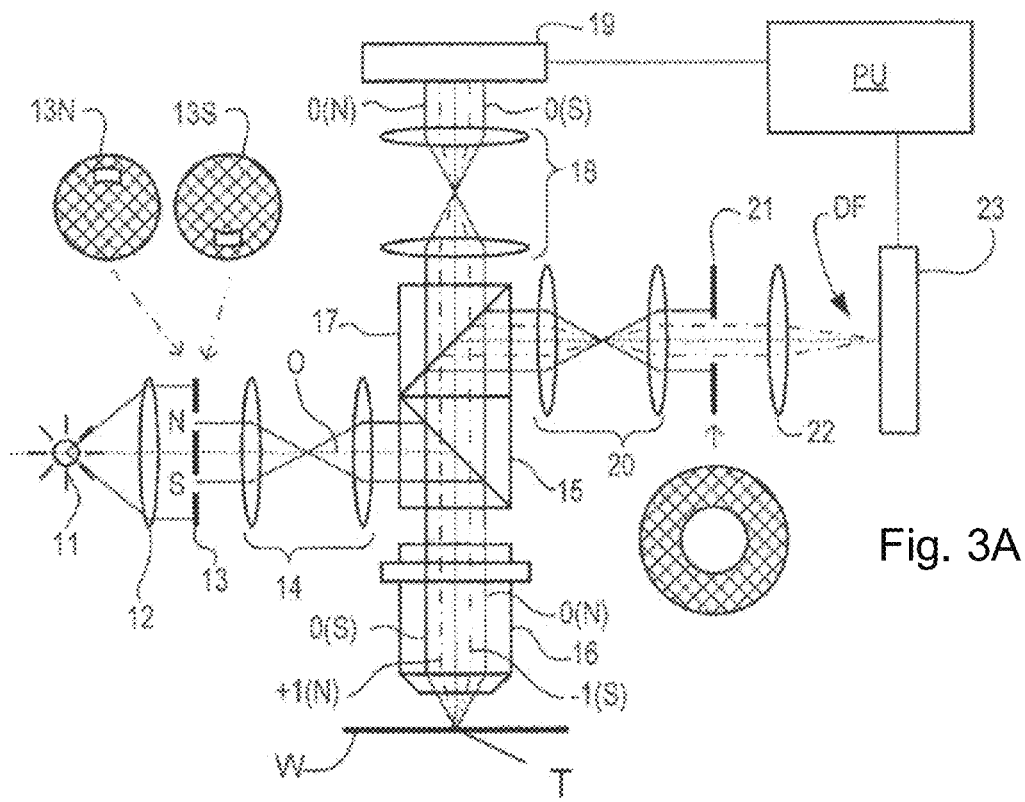
FIG. 3A is schematic diagram of a metrology apparatus for use in measuring targets according to an embodiment using a first pair of illumination apertures providing certain illumination modes.

A metrology apparatus suitable for use in embodiments to measure, e.g., overlay is schematically shown in FIG. 3A. A target T (comprising a periodic structure such as a grating) and diffracted rays are illustrated in more detail in FIG. 3B. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access to an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figures 3B, 3C, 3D:
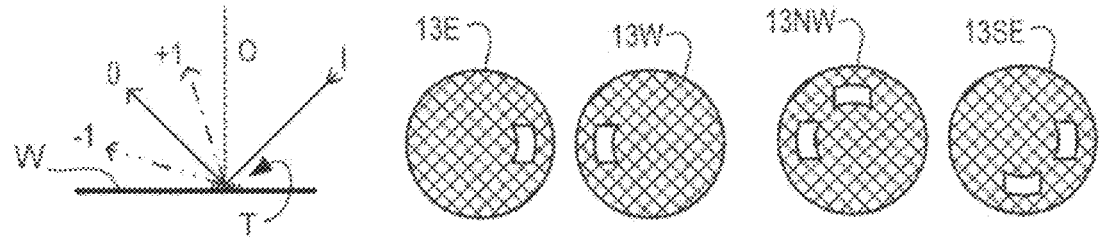
FIG. 3B is a schematic detail of a diffraction spectrum of a target for a given direction of illumination.
FIG. 3C is a schematic illustration of a second pair of illumination apertures providing further illumination modes for diffraction based overlay measurements.
FIG. 3D is a schematic illustration of a third pair of illumination apertures combining the first and second pairs of apertures providing further illumination modes for diffraction based overlay measurements.

As shown in FIG. 3B, target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3A and 3B are shown somewhat off axis, purely to enable them to be more easily distinguished in the diagram. At least the 0 and +1 orders diffracted by the target on substrate W are collected by objective lens 16 and directed back through prism 15.

Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements. The pupil plane image can also be used for other measurement purposes such as reconstruction, as described further hereafter.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane of the objective lens 16. Aperture stop 21 functions to block the zeroth order diffracted beam so that the image of the target formed on sensor 23 is formed from the −1 or +1 first order beam. Data regarding the images measured by sensors 19 and 23 are output to processor and controller PU, the function of which will depend on the particular type of measurements being performed. Note that the term 'image' is used in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment, on-axis illumination of the target is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3C and D. FIG. 3C illustrates two further types of off-axis illumination mode. In a first illumination mode of FIG. 3C, aperture plate 13E provides off-axis illumination from a direction designated, for the sake of description only, as 'east' relative to the 'north' previously described. In a second illumination mode of FIG. 3C, aperture plate 13W is used to provide similar illumination, but from an opposite direction, labeled 'west'. FIG. 3D illustrates two further types of off-axis illumination mode. In a first illumination mode of FIG. 3D, aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
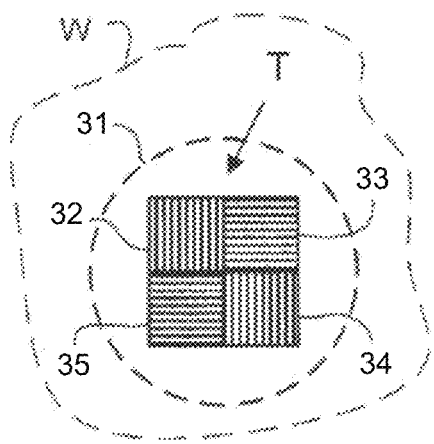
FIG. 4 schematically depicts a form of multiple periodic structure (e.g., multiple grating) target and an outline of a measurement spot on a substrate.

FIG. 4 depicts an example composite metrology target T formed on a substrate. The composite target comprises four periodic structures (in this case, gratings) 32, 33, 34, 35 positioned closely together. In an embodiment, the periodic structure layout may be made smaller than the measurement spot (i.e., the periodic structure layout is overfilled). Thus, in an embodiment, the periodic structures are positioned closely enough together so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 μm×20 μm or within 16 μm×16 μm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets −d and +d respectively. While four periodic structures are illustrated, another embodiment may include a larger matrix to obtain desired accuracy. For example, a 3×3 array of nine composite periodic structures may have biases −4 d, −3 d, −2 d, −d, 0, +d, +2 d, +3 d, +4 d. Separate images of these periodic structures can be identified in an image captured by sensor 23.

Figure 5:
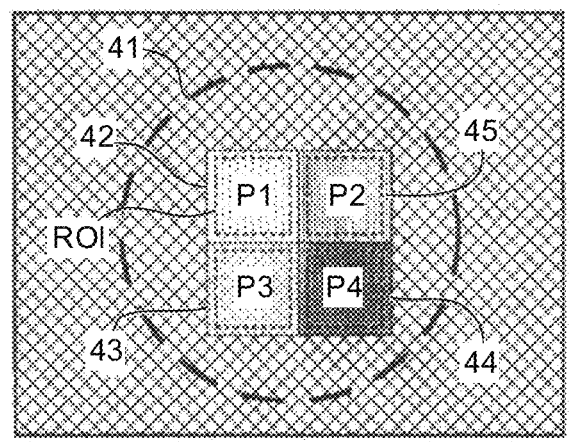
FIG. 5 schematically depicts an image of the target of FIG. 4 obtained using the apparatus of FIG. 3A.

FIG. 5 shows an example of an image that may be formed on and detected by the sensor 23, using the target of FIG. 4 in the apparatus of FIG. 3, using the aperture plates 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. The target can be positioned in among device product features, rather than or in addition to in a scribe lane. If the periodic structures are located in device product areas, device features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities P1-P4 of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
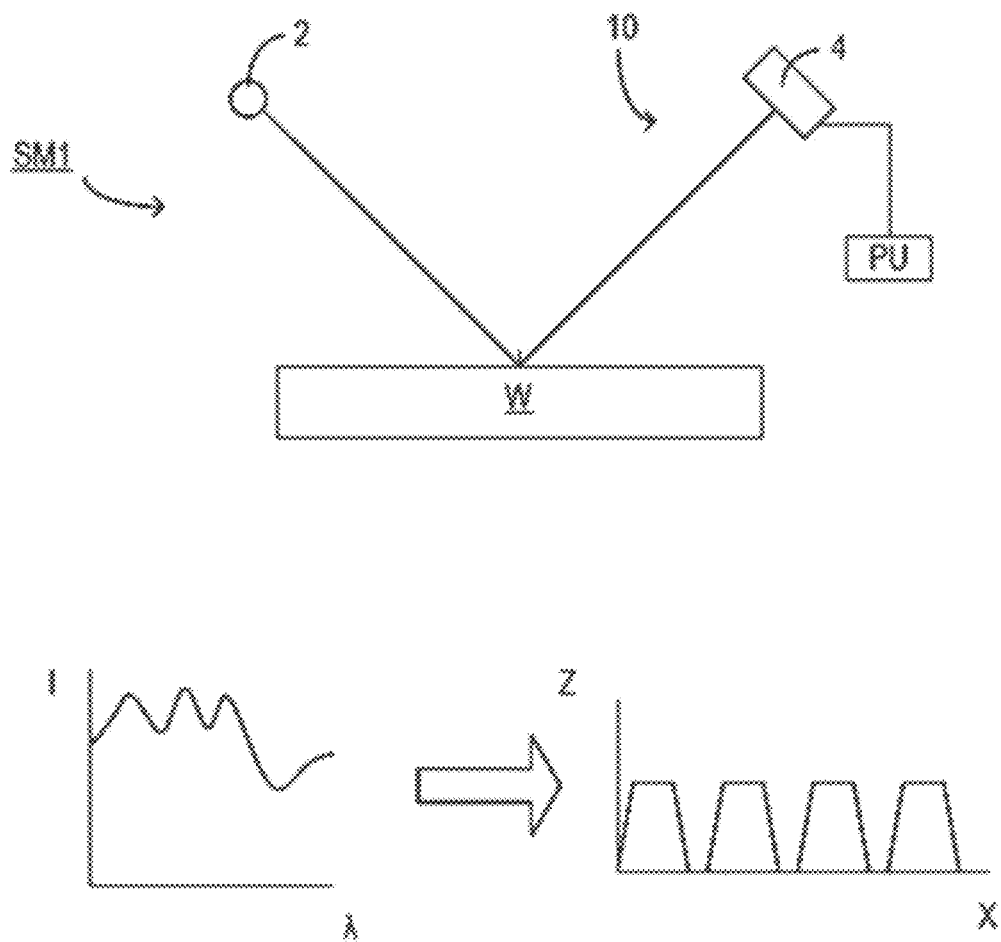
FIG. 6 schematically depicts an example metrology apparatus and metrology technique.

In an embodiment, one of the parameters of interest of a patterning process is feature width (e.g., CD). FIG. 6 depicts a highly schematic example metrology apparatus (e.g., a scatterometer) that can enable feature width determination. It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 6. In general, for the reconstruction, the general form of the structure is known and some variables are assumed from knowledge of the process by which the structure was made, leaving only a few variables of the structure to be determined from the measured data. Such a metrology apparatus may be configured as a normal-incidence metrology apparatus or an oblique-incidence metrology apparatus. Moreover, in addition to measurement of a parameter by reconstruction, angle resolved scatterometry is useful in the measurement of asymmetry of features in product and/or resist patterns. A particular application of asymmetry measurement is for the measurement of overlay, where the target comprises one set of periodic features superimposed on another. The concepts of asymmetry measurement in this manner are described, for example, in U.S. patent application publication US2006-066855, which is incorporated herein in its entirety.

Figure 7:
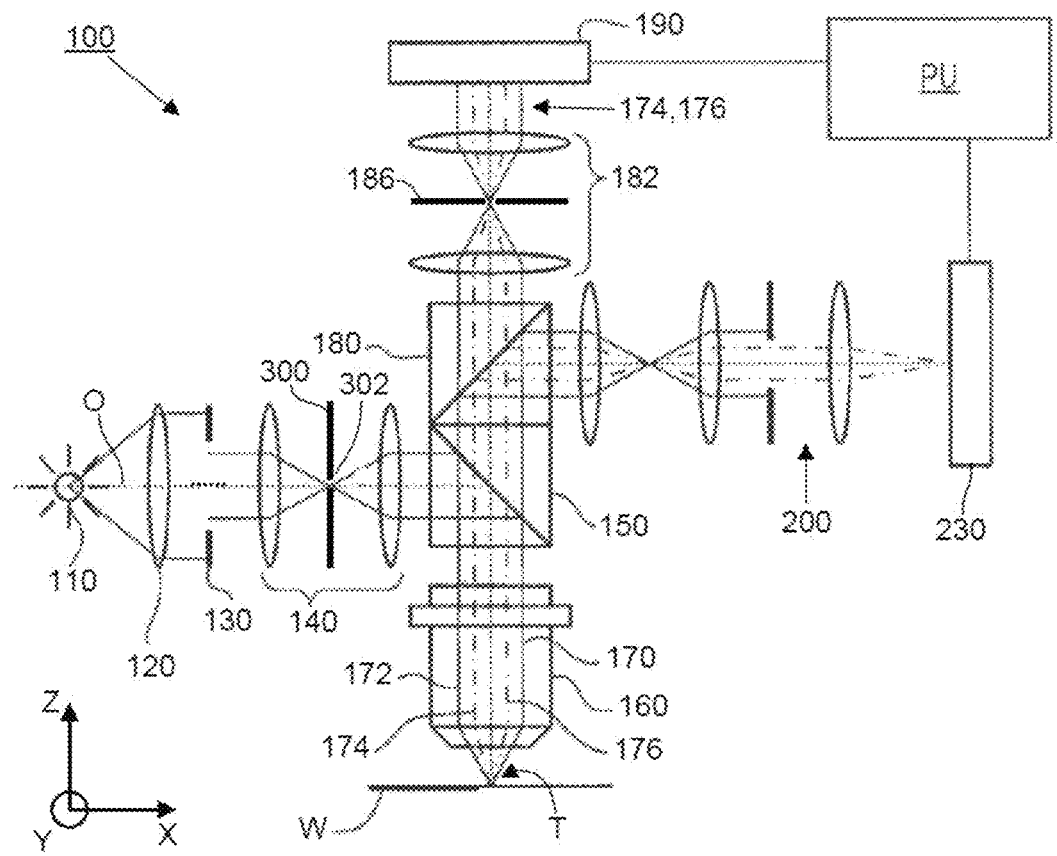
FIG. 7 schematically depicts an example metrology apparatus.

FIG. 7 illustrates an example of a metrology apparatus 100 suitable for use in embodiments of the invention disclosed herein. The principles of operation of this type of metrology apparatus are explained in more detail in the U.S. patent application nos. US 2006-033921 and US 2010-201963, which are incorporated herein in their entireties by reference. An optical axis, which has several branches throughout the apparatus, is represented by a dotted line O.

In this apparatus, radiation emitted by source 110 (e.g., a xenon lamp) is directed onto substrate W via by an optical system comprising: lens system 120, aperture plate 130, lens system 140, a partially reflecting surface 150 and objective lens 160. In an embodiment these lens systems 120, 140, 160 are arranged in a double sequence of a 4F arrangement. In an embodiment, the radiation emitted by radiation source 110 is collimated using lens system 120. A different lens arrangement can be used, if desired. The angular range at which the radiation is incident on the substrate can be selected by defining a spatial intensity distribution in a plane that presents the spatial spectrum of the substrate plane. In particular, this can be done by inserting an aperture plate 130 of suitable form between lenses 120 and 140, in a plane which is a back-projected image of the objective lens pupil plane. Different intensity distributions (e.g., annular, dipole, etc.) are possible by using different apertures. The angular distribution of illumination in radial and peripheral directions, as well as properties such as wavelength, polarization and/or coherency of the radiation, can all be adjusted to obtain desired results. For example, one or more interference filters 135 (see FIG. 9) can be provided between source 110 and partially reflecting surface 150 to select a wavelength of interest in the range of, say, 400-900 nm or even lower, such as 200-300 nm. The interference filter may be tunable rather than comprising a set of different filters. A grating could be used instead of an interference filter. In an embodiment, one or more polarizers 175 (see FIG. 9) can be provided between source 110 and partially reflecting surface 150 to select a polarization of interest. The polarizer may be tunable rather than comprising a set of different polarizers.

As shown in FIG. 7, the target T is placed with substrate W normal to the optical axis O of objective lens 160. Thus, radiation from source 110 is reflected by partially reflecting surface 150 and focused into an illumination spot S (see FIG. 8) on target T on substrate W via objective lens 160. In an embodiment, objective lens 160 has a high numerical aperture (NA), desirably at least 0.9 or at least 0.95. An immersion metrology apparatus (using a relatively high refractive index fluid such as water) may even have a numerical aperture over 1.

Rays of illumination 170, 172 focused to the illumination spot from angles off the axis O gives rise to diffracted rays 174, 176. It should be remembered that these rays are just one of many parallel rays covering an area of the substrate including target T. Each element within the illumination spot is within the field of view of the metrology apparatus. Since the aperture in plate 130 has a finite width (necessary to admit a useful quantity of radiation), the incident rays 170, 172 will in fact occupy a range of angles, and the diffracted rays 174, 176 will be spread out somewhat. According to the point spread function of a small target, each diffraction order will be further spread over a range of angles, not a single ideal ray as shown.

At least the $0^{th}$ order diffracted by the target on substrate W is collected by objective lens 160 and directed back through partially reflecting surface 150. An optical element 180 provides at least part of the diffracted beams to optical system 182 which forms a diffraction spectrum (pupil plane image) of the target T on sensor 190 (e.g. a CCD or CMOS sensor) using the zeroth and/or first order diffractive beams. In an embodiment, an aperture 186 is provided to filter out certain diffraction orders so that a particular diffraction order is provided to the sensor 190. In an embodiment, the aperture 186 allows substantially or primarily only zeroth order radiation to reach the sensor 190. In an embodiment, the sensor 190 may be a two-dimensional detector so that a two-dimensional angular scatter spectrum of a substrate target T can be measured. The sensor 190 may be, for example, an array of CCD or CMOS sensors, and may use an integration time of, for example, 40 milliseconds per frame. The sensor 190 may be used to measure the intensity of redirected radiation at a single wavelength (or narrow wavelength range), the intensity separately at multiple wavelengths or integrated over a wavelength range. Furthermore, the sensor may be used to separately measure the intensity of radiation with transverse magnetic- and/or transverse electric-polarization and/or the phase difference between transverse magnetic- and transverse electric-polarized radiation.

Optionally, optical element 180 provides at least part of the diffracted beams to measurement branch 200 to form an image of the target on the substrate W on a sensor 230 (e.g. a CCD or CMOS sensor). The measurement branch 200 can be used for various auxiliary functions such as focusing the metrology apparatus (i.e., enabling the substrate W to be in focus with the objective 160), and/or for dark field imaging of the type described above with reference to FIGS. 3-5.

In order to provide a customized field of view for different sizes and shapes of grating, an adjustable field stop 300 is provided within the lens system 140 on the path from source 110 to the objective lens 160. The field stop 300 contains an aperture 302 and is located in a plane conjugate with the plane of the target T, so that the illumination spot becomes an image of the aperture 302. The image may be scaled according to a magnification factor, or the aperture and illumination spot may be in 1:1 size relation. In order to make the illumination adaptable to different types of measurement, the aperture plate 300 may comprise a number of aperture patterns formed around a disc, which rotates to bring a desired pattern into place. Alternatively or in addition, a set of plates 300 could be provided and swapped, to achieve the same effect. Additionally or alternatively, a programmable aperture device such as a deformable mirror array or transmissive spatial light modulator can be used also.

Typically, a target will be aligned with its periodic structure features running either parallel to the Y axis or parallel to the X axis. With regard to its diffractive behavior, a periodic structure with features extending in a direction parallel to the Y axis has periodicity in the X direction, while a periodic structure with features extending in a direction parallel to the X axis has periodicity in the Y direction. In order to measure the performance in both directions, both types of features are generally provided. While for simplicity there will be reference to lines and spaces, the periodic structure need not be formed of lines and space. Moreover, each line and/or space between lines may be a structure formed of smaller sub-structures. Further, the periodic structure may be formed with periodicity in two dimensions at once, for example where the periodic structure comprises posts and/or via holes.

Figure 8:
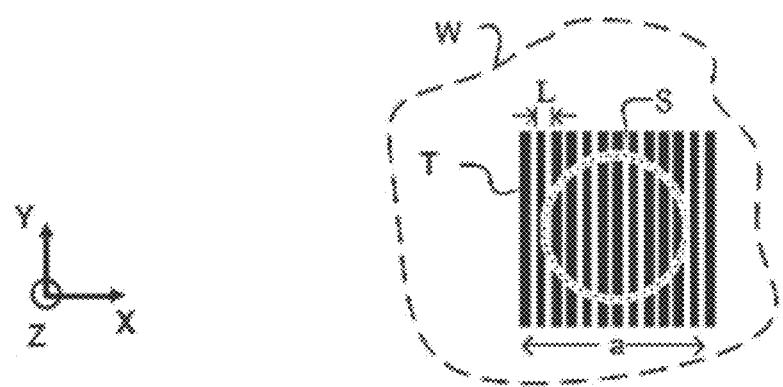
FIG. 8 illustrates the relationship between an illumination spot of a metrology apparatus and a metrology target.

FIG. 8 illustrates a plan view of an example target T, and the extent of illumination spot S in the apparatus of FIG. 7. To obtain a diffraction spectrum that is free of interference from surrounding structures, the target T, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. This simplifies mathematical reconstruction of the target as it can be regarded as infinite.

Figure 9:
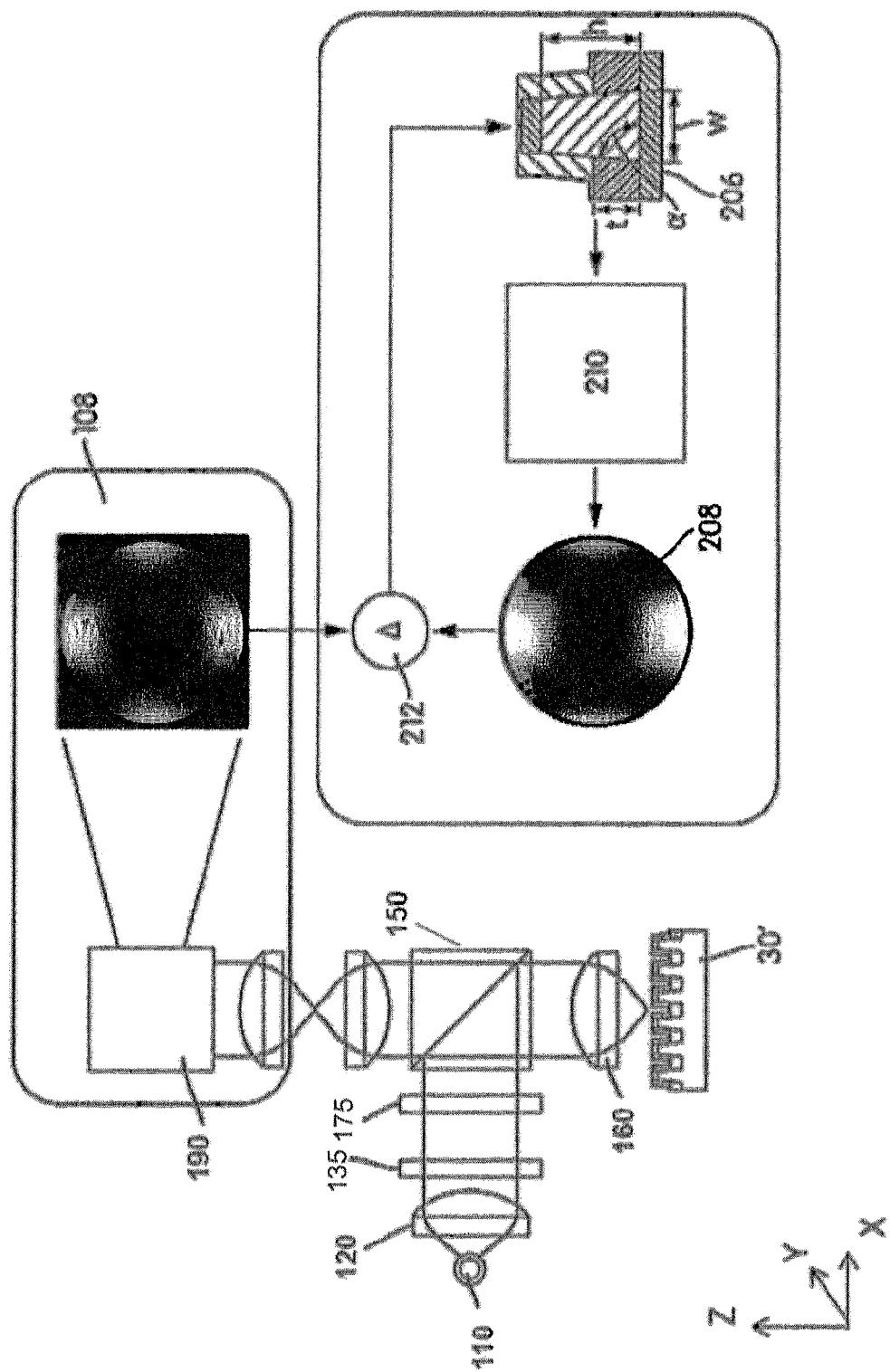
FIG. 9 schematically depicts a process of deriving one or more variables of interest based on measurement data.

FIG. 9 schematically depicts an example process of the determination of the value of one or more variables of interest of a target pattern 30' based on measurement data obtained using metrology. Radiation detected by the detector 190 provides a measured radiation distribution 108 for target 30'.

For the given target 30', a radiation distribution 208 can be computed/simulated from a parameterized mathematical model 206 using, for example, a numerical Maxwell solver 210. The parameterized mathematical model 206 shows example layers of various materials making up, and associated with, the target. The parameterized mathematical model 206 may include one or more of variables for the features and layers of the portion of the target under consideration, which may be varied and derived. As shown in FIG. 9, the one or more of the variables may include the thickness t of one or more layers, a width w (e.g., CD) of one or more features, a height h of one or more features, a sidewall angle $\alpha$ of one or more features, and/or relative position between features (herein considered overlay). Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. One or more values of one or more parameters of a 1-D periodic structure or a 2-D periodic structure, such as a value of width, length, shape or a 3-D profile characteristic, may be input to the reconstruction process from knowledge of the patterning process and/or other measurement processes. For example, the initial values of the variables may be those expected values of one or more parameters, such as a value of CD, pitch, etc., for the target being measured.

In some cases, a target can be divided into a plurality of instances of a unit cell. To help ease computation of the radiation distribution of a target in that case, the model 206 can be designed to compute/simulate using the unit cell of the structure of the target, where the unit cell is repeated as instances across the full target. Thus, the model 206 can compute using one unit cell and copy the results to fit a whole target using appropriate boundary conditions in order to determine the radiation distribution of the target.

Additionally or alternatively to computing the radiation distribution 208 at the time of reconstruction, a plurality of radiation distributions 208 can be pre-computed for a plurality of variations of variables of the target portion under consideration to create a library of radiation distributions for use at the time of reconstruction.

The measured radiation distribution 108 is then compared at 212 to the computed radiation distribution 208 (e.g., computed near that time or obtained from a library) to determine the difference between the two. If there is a difference, the values of one or more of the variables of the parameterized mathematical model 206 may be varied, a new computed radiation distribution 208 obtained (e.g., calculated or obtained from a library) and compared against the measured radiation distribution 108 until there is sufficient match between the measured radiation distribution 108 and the radiation distribution 208. At that point, the values of the variables of the parameterized mathematical model 206 provide a good or best match of the geometry of the actual target 30'. In an embodiment, there is sufficient match when a difference between the measured radiation distribution 108 and the computed radiation distribution 208 is within a tolerance threshold.

As discussed above, one or more parameters of interest (such as CD and/or overlay) can be determined from a structure of a target (e.g., a diffracting target within a product pattern or a diffracting target specially designed for measurement and separate from a device pattern) by illuminating the target, collecting the redirected radiation from the structure using an objective lens, and detecting the redirected radiation by a pupil detector in a Fourier plane of the objective lens. Such a measured pupil can be processed using, for example, an inference method that obtains signal components therefrom, which signal components are combined with an appropriate set of weights to yield, e.g., an overlay value. See, e.g., United States patent application no. US 2017-0255737, which is incorporated therein in its entirety by reference. Additionally or alternatively, a method such as described with respect to FIG. 9 can use such a measured pupil to determine, e.g., CD.

In an embodiment, the radiation used to illuminate the target is linearly-polarized electromagnetic radiation. Linear polarization has the electric field of the electromagnetic radiation confined to a single plane along the direction of propagation. In an embodiment, a first type of linear polarization in a first direction perpendicular to the direction of propagation is designated herein for convenience as "H" or horizontal linear polarization and a second type of linear polarization in a second direction that is orthogonal to the first direction and is perpendicular to the direction of propagation is designated herein for convenience as "V" or vertical linear polarization. Of course, the radiation need not be vertical or horizontal. The first linear polarization can be p polarization and the second linear polarization can be s polarization. Of course, the first and second linear polarization can be labelled with other designations.

A diffracting structure (e.g., a diffraction grating) and other similarly complex structure changes the polarization state of illumination radiation. So, in an embodiment, the optical properties of a target comprising a structure under study can be characterized by a reflectivity matrix as follows:

$$\begin{pmatrix} R_{HH} & R_{HV} \\ R_{VH} & R_{VV} \end{pmatrix}$$

wherein R is the reflectivity and the subscripts correspond to the applicable linear polarization. In particular, the first index of the subscript refers to the polarization state of the outgoing radiation from the target, and the second index of the subscripts refers to the polarization state of the illumination radiation onto the target. For example, $R_{HV}$ means reflectivity to the H polarization from V-polarized illumination. Each element of this matrix depends on wavelength, and polar and azimuthal angles of incidence. Of course, the structures can be characterized by the reflectivity matrices in a s and p polarization basis or other basis. Further, while embodiments are described herein in terms of reflectivity, a different or additional optical characteristic can be used than reflectivity, which different or additional optical characteristic can be determined in similar respects at different illumination polarizations and outgoing polarizations. Further, while embodiments are described herein in terms of two different types of linear polarization, more than two types of linear polarization can be used.

In a metrology apparatus, the observable quantities by a detector can be total reflected intensities. That is, the detection is not polarization-sensitive. Therefore, if illumination is H-polarized, then the detected intensity is directly proportional to:

$$|R_{HH}|^2 + |R_{VH}|^2$$

and if illumination is V-polarized, then the detected intensity is proportional to:

$$|R_{VV}|^2 + |R_{HV}|^2$$

However, it is expected that different polarization channels (i.e. different elements of the reflectivity matrix) carry different information about a parameter of interest such as CD and/or overlay. Therefore, in an embodiment, it is advantageous to detect outgoing H linear polarization and V linear polarization radiation from the target to, for example, separately de-correlate more profile parameters (e.g., as part of the inference method) and increase sensitivity to them. Thus, in an embodiment, a combination of values associated with at least two selected from $R_{HH}$, $R_{VH}$, $R_{VV}$, and $R_{HV}$ (or an additional or different optical characteristic as described above) are used to derive a parameter of interest (e.g., overlay, CD, etc.). As will be appreciated, the combination can be used to derive a single value of the parameter of interest. In an embodiment, values corresponding to $R_{HH}$, $R_{VH}$, $R_{VV}$, and $R_{HV}$ are used together to derive a parameter of interest. In an alternative embodiment, only values corresponding to $R_{VH}$ and $R_{HV}$ are used to derive the parameter of interest.

Figure 10:
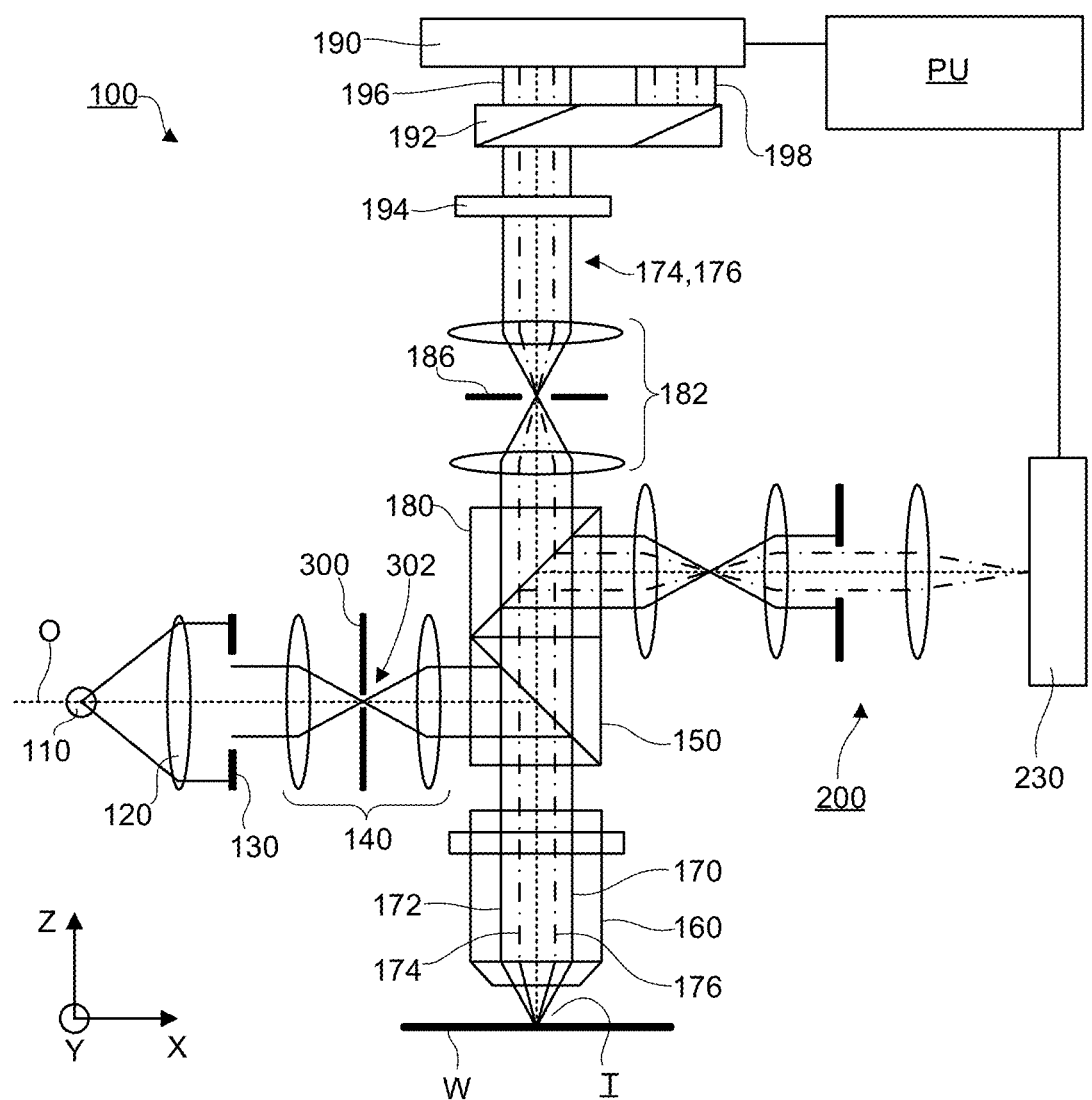
FIG. 10 schematically depicts an example metrology apparatus.

FIG. 10 schematically depicts an example metrology apparatus according to an embodiment to enable separate detection of outgoing H- and V-polarizations from the target. This embodiment is similar to the metrology apparatus of FIG. 7 with some changes. In particular, in an embodiment, the metrology apparatus comprises a cross-polarizing element 192 before the pupil sensor 190 to separate the outgoing polarization states of radiation into a first portion 196 having a first linear polarization and a second portion 198 having a second different linear polarization. The cross-polarizing element 192 provides the ability to measure values associated with $R_{HH}$, $R_{VH}$, $R_{VV}$, and $R_{HV}$ separately, such as $|R_{HH}|^2$, $|R_{VH}|^2$, $|R_{VV}|^2$, and $|R_{HV}|^2$ respectively, by applying horizontal linear polarization illumination radiation to the target and separately applying vertical linear polarization illumination radiation to the same target. Thus, for the H polarization, the cross-polarizing element 192 enables the outgoing V and H polarization to be separately measured to obtain $|R_{VH}|^2$ and $|R_{HH}|^2$ respectively. Similarly, for the V polarization, the cross-polarizing element 192 enables the outgoing V and H polarization to be separately measured to obtain $|R_{VV}|^2$ and $|R_{HV}|^2$ respectively.

In an embodiment, the different polarizations can be alternately provided to the target. For example, in an embodiment, the source 110 can alternately provide in time H and V polarization. In an embodiment, a polarizing element in the optical path between the source 110 and the target can be used to alternately provide in time H and V polarization (e.g., using a polarizer 175 as depicted in FIG. 9 and which can be similarly provided between the source 110 and the objective 160 in FIGS. 7 and 10).

In an embodiment, a plurality of illumination spots can be provided in parallel, one or more of those illumination spots having H polarization and one or more other of those illuminations having V polarization. So, in an embodiment having two illuminations spots with one spot having V polarization and the other H polarization, the cross-polarizing element 192 can split the polarizations from each of the spots separately to measure 4 sets of linear polarization—V polarized outgoing radiation from the target for V illumination, H polarized outgoing radiation from the target for V illumination, V polarized outgoing radiation from the target for H illumination, and H polarized outgoing radiation from the target for H illumination.

In an embodiment, the cross-polarizing element 192 can be differently arranged. For example, it can be in a polarizing beam splitter-type arrangement where a particular linear polarization passes through the beam splitting surface in a first direction toward one sensor 190 in the first direction and the orthogonal linear polarization reflects off the beam splitting surface in a second direction substantially orthogonal to the first direction to another sensor 190 in the second direction. Other arrangements are possible including other beam directing components.

However, a cross-polarized detection alone is not sensitive to phases of reflectivity coefficients, as only their absolute values are measured. In order to be able to measure at least some relative phases, a retarder 194 (e.g., a quarter-wave plate) is positioned before the cross-polarizing element 192. In such a retarder 194 and cross-polarizing element 192 configuration, two output intensity channels for H polarized illumination of the target are:

$$|R_{HH} \pm iR_{VH}|^2 = |R_{HH}|^2 + |R_{VH}|^2 \pm 2\, \mathrm{Im}(R_{HH} R_{VH}^*)$$

and for V polarized illumination of the target are:

$$|R_{VV} \pm iR_{HV}|^2 = |R_{VV}|^2 + |R_{HV}|^2 \pm 2\, \mathrm{Im}(R_{VV} R_{HV}^*)$$

The interference terms carry information about relative phases between on-diagonal and off-diagonal channels of the reflectivity matrix.

Thus, a metrology apparatus may be provided which is capable of performing a metrology process with plural different polarization settings. Each polarization setting defines a polarization property of incident radiation of the metrology process (which may be referred to as an incident radiation channel). Each polarization setting further defines a polarization property of detected radiation of the metrology process (which may be referred to as a detected radiation channel).

In the metrology process described above with reference to FIG. 10, examples of a polarization property of the incident radiation channel include H (or horizontal linear polarization) and V (or vertical linear polarization). Other polarization properties are possible, including s and p polarizations. In an embodiment, the polarization property of the incident radiation channel is defined by a polarizer provided between the source 110 and the target T.

In the metrology process described above with reference to FIG. 10, examples of a polarization property of the detected radiation channel include H (or horizontal linear polarization) and V (or vertical linear polarization). Other polarization properties are possible, including s and p polarizations. In an embodiment, the polarization property of the detected radiation channel is defined by a polarizer provided between the target T and a sensor 190, 230 used to detect radiation scattered from the target T.

Four examples of different polarization settings thus include the following: incident=H, detected=H (which may be referred to as HH or H/H); incident=H, detected=V (which may be referred to as HV or H/N); incident=V, detected=H (which may be referred to as VH or V/H); and incident=V, detected=V (which may be referred to as V/V or VV).

Various other settings may be used in the metrology process. These include:
a. a setting that defines which diffraction order is detected from a periodic structure in the target T (e.g. zeroth order, +1 order or −1 order);
b. a setting that defines a bias in a periodic structure in the target T (e.g. +d or −d, or any other bias);
c. a setting that defines a direction of periodicity of a periodic structure in the target T (e.g. X-direction periodic structure or Y-direction periodic structure).

Comparisons made between measurements obtained using the metrology process with different settings are subject to errors caused by unwanted differences in conditions (e.g. differences in optical path and/or optical components such as fibers). These errors may cause an intensity asymmetry between scattered radiation from equal and opposite diffraction orders that is not caused by the target T, and/or a polarization imbalance (resulting, for example, in a difference in intensity or intensity distribution) between scattered radiation corresponding to different polarization settings that is not caused by the target T.

An error contributing to the intensity asymmetry between scattered radiation from equal and opposite diffraction orders may be referred to as a sensor asymmetry and is labelled below as $\delta$. The polarization imbalance is referred to below as $\theta$.

In an example case where a target T is a multiple periodic structure target comprising four periodic structures (gratings) with different biases and orientations, as depicted in FIG. 4, and the target T is rotated to different positions (e.g. angular position in degrees=0, 90, 180, or 270), the effect of $\delta$ and $\theta$ on a detected intensity may be written in terms of a linear disturbance as follows:

$$_{polarization\ setting}^{target\ site}I_{substrate\ rotation}^{wedge\ order}(1+\delta)$$
$$(1+\theta)_{grating\ polarization}^{grating\ direction, bias\ grating\ order}$$

The intensity, I, on the left side of the equation represents an intensity measured using the metrology process for a given target site St1-4 (see FIGS. 12 and 13), polarization setting (e.g. H/H, HN, V/H, or V/V), wedge order (defining which diffraction order is received), and substrate angular position (e.g. 0 degrees, 90 degrees, 180 degrees, or 270 degrees).

The intensity, I, on the right side of the equation represents an intensity that would be obtained with $\delta$ and $\theta$ both zero and defined relative to properties of the target T. This intensity I is a function of the direction of periodicity of the periodic structure at the relevant target site St1-4 (referred to as grating direction, e.g. X or Y), the bias of the periodic structure at the relevant target site St1-4 (e.g. +d or −d, or any other bias), the grating order (defining the diffraction order, e.g. +1 or −1, corresponding to the wedge order), and the polarization setting relative to the periodic structure at the relevant target site St1-4. The combination of target site St1-4 and substrate angular position defines which periodic structure is being analyzed.

In an embodiment, different combinations of settings (e.g. different grating directions, biases, orders, polarization settings, and angular positions) yield 128 measured intensities and 128 corresponding equations. These equations can be solved to yield values for $\delta$ and $\theta$. If more degrees of freedom are available (e.g. more possibilities for one or more of grating directions, biases, orders, polarization settings, and angular positions), a larger number of equations may be obtained and solved to yield values for $\delta$ and $\theta$. For example, there will often be two possible biases (e.g. +d and -d), but further biases or continuous biases may be used, which may be dealt with by measuring further intensities to solve additional equations and/or by interpolation techniques.

Figure 11:
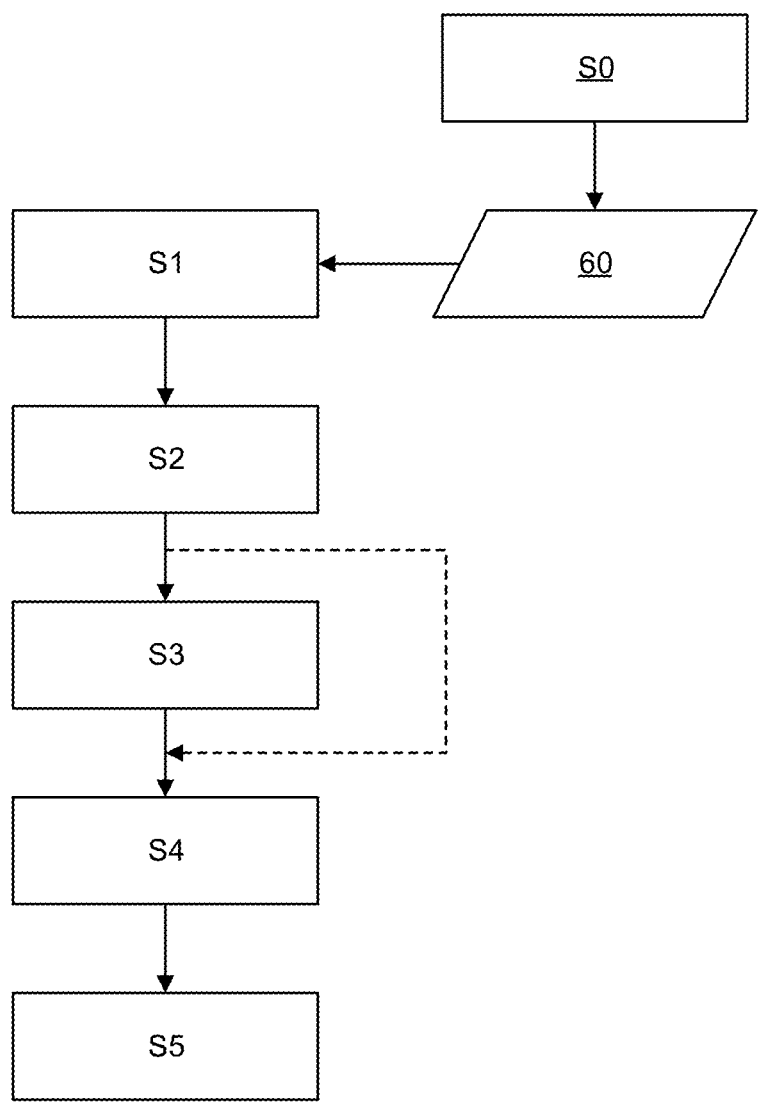
FIG. 11 depicts an example method of determining a value of a parameter of interest.

In an embodiment, as depicted schematically in FIG. 11, a method of determining a value of a parameter of interest of a patterning process is provided based on the above analysis.

In step S1, a plurality of calibration data units 60 are obtained from a metrology process S0. The metrology process S0 may be performed using any of the metrology apparatuses discussed above, for example with reference to FIGS. 3, 6, 7 and 9. Each calibration data unit 60 represents detected radiation scattered from a respective target T in the metrology process. The respective target T may be the same target for at least a subset of the calibration data units 60 or may be a different target for at least a subset of the calibration data units 60. As described above, the target T comprises a structure formed on a substrate W using the patterning process (e.g. forming part of a lithographic manufacturing process). In an embodiment, the target T comprises a multiple periodic structure target, for example as depicted in FIG. 4. In an embodiment, the target T comprises periodic structures in different layers for measuring overlay.

The metrology process is performed by a metrology apparatus capable of applying plural different polarization settings. In an embodiment, each of at least two of the calibration data units 60 represents detected radiation obtained using different respective polarization settings in the metrology process (i.e. different combinations of polarization properties for the incident and detected radiation channels).

In steps S2 and S3, the calibration data units 60 obtained in step S1 are used to obtain calibration information about the metrology process. As described in further detail below, the calibration information may comprise information about polarization imbalance $\theta$ (step S2) and, optionally, information about sensor asymmetry $\delta$ (step S3).

In step S4, a measurement data unit representing detected radiation scattered from a further target T is obtained. The further target T may comprise a structure formed on the same substrate W as the substrate W used to obtain one or more of the calibration data units 60 or may comprise a structure formed on a further substrate W. The further target T is formed using the same patterning process as one or more of the targets T used to obtain the calibration data units 60.

Each calibration data unit 60 and each measurement data unit may comprise various representations of detected radiation, including for example a detected radiation intensity, a detected radiation phase, a detected radiation intensity distribution, or detected radiation phase distribution, in a pupil plane. Alternatively or additionally, each calibration data unit 60 and each measurement data unit comprises: a detected radiation intensity, a detected radiation phase, a detected radiation intensity distribution, or a detected radiation phase distribution, in an image plane.

In step S5, the value of the parameter of interest is determined using the measurement data unit obtained in step S4 and the calibration information obtained in step S2 and, optionally, in step S3. The calibration information may be used for example to reduce the effect of polarization imbalance and/or sensor asymmetry (as defined above).

Various parameters of interest may be determined in step S5. In an embodiment, the structure comprises a multilayered structure and the parameter of interest comprises an overlay error between two or more different layers in the multilayer structure. Alternatively or additionally, the parameter of interest may comprise a focus error, a critical dimension, or any other parameter of interest relevant to controlling a patterning process.

In an embodiment, the different polarization settings used to obtain the calibration data units 60 comprise at least a first polarization setting and a second polarization setting. In an embodiment, the incident radiation of the first polarization setting is polarized differently (e.g. orthogonally) to the incident radiation of the second polarization setting and the detected radiation of the first polarization setting is polarized differently (e.g. orthogonally) to the detected radiation of the second polarization setting.

In an embodiment of this type, a calibration information unit is obtained using a pair of calibration data units 60. In an embodiment, the calibration information unit comprises a value of the polarization imbalance $\theta$ for a particular subset of metrology process settings.

A first calibration data unit 60 of the pair of calibration data units 60 is obtained with the substrate W at a reference angular position using the first polarization setting. A second calibration data unit 60 of the pair of calibration data units 60 is obtained with the substrate W rotated by a predetermined angle (e.g. 90 degrees) relative to the reference angular position using the second polarization setting. In an embodiment, the predetermined angle is equal to an angle between a direction of polarization of incident radiation of the first polarization setting and a direction of polarization of incident radiation of the second polarization setting (e.g. 90 degrees). In an embodiment, the predetermined angle is equal to an angle between a direction of polarization of detected radiation of the first polarization setting and a direction of polarization of detected radiation of the second polarization setting.

Thus, a pair of calibration data units 60 may be obtained at angular positions of the substrate W that are separated by the same angular amount as the angular separation between polarizations in the incident and/or detected radiation. In the specific examples described herein, the predetermined angle is 90 degrees, but other angles are possible, including for example 45 degrees. A target T can thus be subjected to a metrology process that is nominally identical in terms of the directions of polarizations of incident and detected radiation channels relative to the target T, but which is implemented using different polarization settings by the metrology apparatus. This can provide a sensitive measure of the polarization imbalance $\theta$.

In an embodiment, the polarization imbalance $\theta$ is obtained by deriving a normalized difference between measured intensities of the target T after 90 degrees of substrate rotation in a multiple periodic structure target of the type depicted in FIG. 4 (with four periodic structures 32-35). This can be expressed for general metrology settings as follows:

$$\theta = \frac{{}^{Site\,N}_{HV}I_{WR} - {}^{Site\,N-1}_{VH}I_{WR+90}}{{}^{Site\,N}_{HV}I_{WR} + {}^{Site\,N-1}_{VH}I_{WR+90}}$$

where "HV" and "VH" signify that the polarization settings of the two obtained intensities are always opposite (e.g. H/H and V/V, HN and V/H, V/H and H/V or V/V and H/H), "SiteN" and "SiteN−1" indicates that account is taken of the changing of a position of a periodic structure 32-35 due to the rotation of the substrate W, "WR" represents a reference angular position of the substrate and "WR+90" represents the reference angular position+90 degrees rotation.

Figure 12:
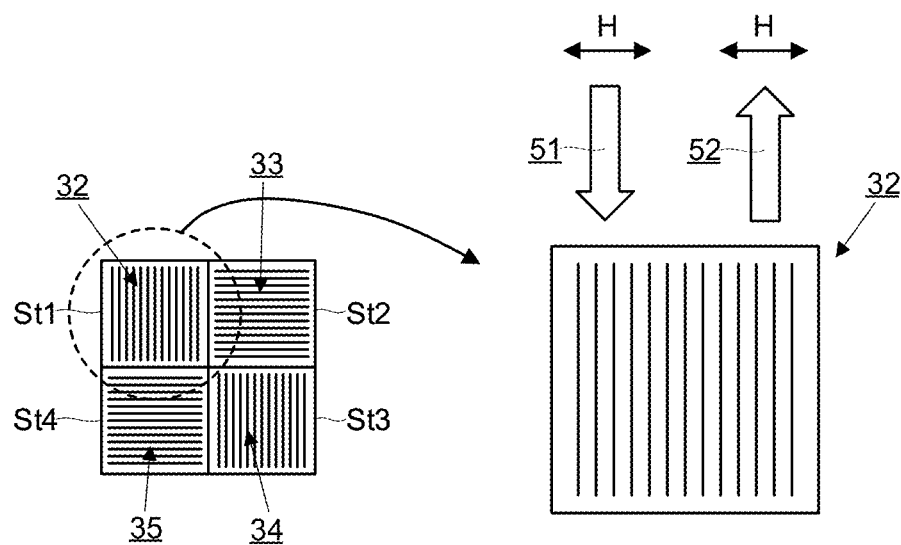
FIG. 12 depicts obtaining, at a first angular position of a substrate, a first intensity of two intensities used to obtain a value of a polarization imbalance.

An example implementation of the above equation is illustrated in FIGS. 11 and 12 and described by the following equation:

$$_{co,pol0}^{x+}\theta_{WR0}^{+1} = \frac{_{H/H}^{Site1}I_{WR0}^{+1} - _{V/V}^{Site4}I_{WR90}^{+1}}{_{H/H}^{Site1}I_{WR0}^{+1} + _{V/V}^{Site4}I_{WR90}^{+1}}$$

where $_{co,pol0}^{x+}\theta_{WR0}^{+1}$ represents the value of θ corresponding to the combination of metrology process settings in which a +1 diffraction order of a positively biased X direction periodic structure is measured using a polarization setting in which the incident and detected radiation channels are co-polarized and at 0 degrees relative to a direction of periodicity of the periodic structure.

Figure 13:
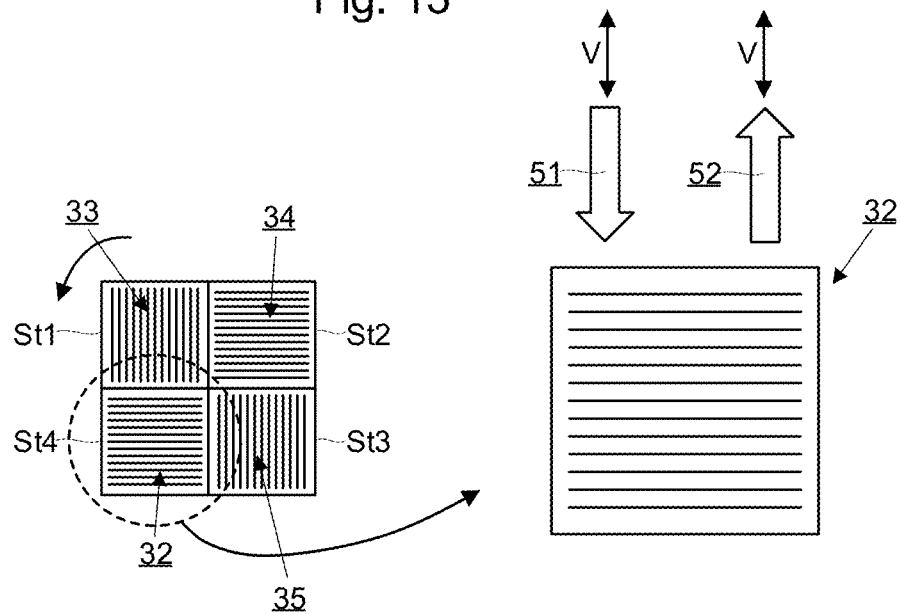
FIG. 13 depicts obtaining, at a second angular position of the substrate, a second intensity of the two intensities used to obtain the value of the polarization imbalance.

The value of θ in this case is obtained by deriving a normalized difference between an intensity obtained as shown in FIG. 12 ($_{H/H}^{Site1}I_{WR0}^{+1}$) and an intensity obtained as shown in FIG. 13 ($_{V/V}^{Site4}I_{WR90}^{+1}$).

FIG. 12 (left) depicts a target T at an angular position of the substrate W of 0 degrees. Sites 1-4 are respectively labelled St1, St2, St3 and St4. An intensity is obtained from the X direction periodic structure 32 having a bias of +d positioned at St1 using a polarization setting depicted in FIG. 12 (right). The polarization setting is such that the polarization property of the incident radiation channel 51 is H and the polarization property of the detected radiation channel 52 is also H. The incident and detected radiation channels are thus co-polarized in this example and parallel with the direction of periodicity of the X direction periodic structure 32.

FIG. 13 (left) depicts the target T of FIG. 11 at an angular position of the substrate W of 90 degrees (rotated anticlockwise). Sites 1-4 are respectively labelled St1, St2, St3 and St4. The periodic structure 32 having the bias of +d has moved from St1 to St4 and the X direction periodic structure has become a Y direction periodic structure. An intensity is obtained from the Y direction periodic structure 32 at St4 using a polarization setting depicted in FIG. 13 (right). The polarization setting is such that the polarization property of the incident radiation channel 51 is V and the polarization property of the detected radiation channel 52 is also V. The incident and detected radiation channels are thus copolarized and still parallel with the direction of periodicity of the periodic structure 32 (albeit parallel to the Y direction now rather than the X direction).

From the point of view of the periodic structure 32, the polarization properties of the incident radiation channel 51 and the detected radiation channel 52 are the same for the metrology process performed in FIG. 12 and the metrology process performed in FIG. 13 (i.e. co-polarized parallel to the direction of periodicity of the periodic structure 32). Any non-zero value of 8 thus provides a measure of the polarization imbalance.

The embodiments described above with reference to FIGS. 12 and 13 fall within a class of embodiment in which a first calibration data unit of a first pair of calibration data units is obtained with the substrate at a reference angular position (e.g. as shown in FIG. 12) and a second calibration data unit of the first pair of calibration data units is obtained with the substrate rotated through a predetermined angle away from the reference angular position. In some embodiments, the predetermined angle is 90 degrees (e.g. as shown in FIG. 13), although other angles such as oblique angles may be used. The calibration data units are used to obtain first calibration information that can be used subsequently to determine the value of a parameter of interest with improved accuracy. In the embodiments described above with reference to FIGS. 11 and 12, the first calibration information comprises information about polarization imbalance θ. This is achieved by arranging for the first calibration data unit to be obtained using a first polarization setting and for the second calibration data unit to be obtained using a second polarization setting. An angle between a direction of polarization of incident radiation of the first polarization setting and a direction of polarization of incident radiation of the second polarization setting is equal to the predetermined angle (e.g. 90 degrees), or an angle between a direction of polarization of detected radiation of the first polarization setting and a direction of polarization of detected radiation of the second polarization setting is equal to the predetermined angle (e.g. 90 degrees). The general approach of using measurements with a substrate at 0 degrees and at a predetermined angle away from 0 degrees (e.g. 90 degrees) can be used for determining other types of calibration information without necessarily requiring use of different polarization settings.

Figure 14:
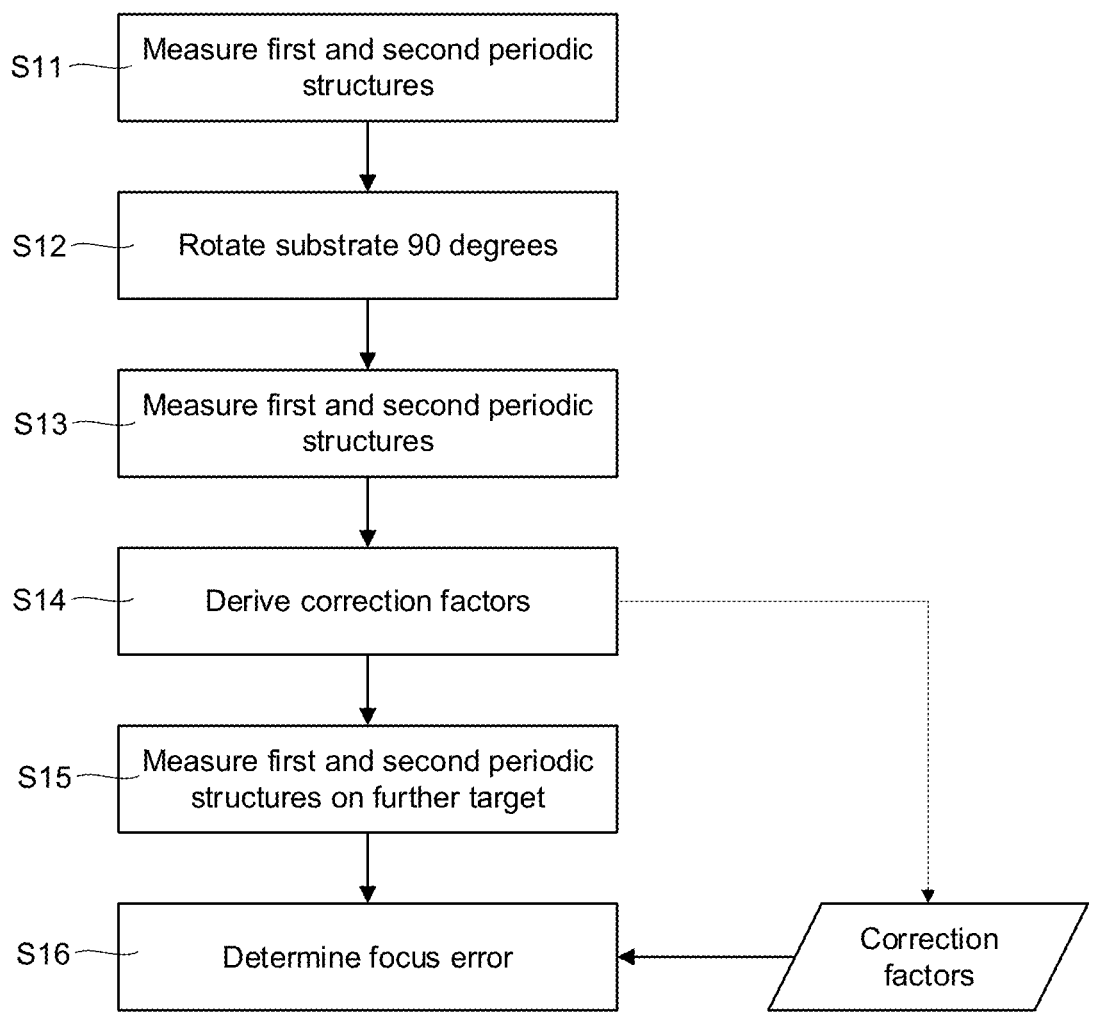
FIG. 14 is a flow chart depicting a method of determining focus error in which correction factors are obtained from measurements of an initial target at substrate rotation positions of 0 and 90 degrees.

In some embodiments, the above approach is used to determine calibration information for correcting measurements of a parameter of interest in a patterning process used to form a structure on a substrate. In an embodiment, the approach is used to determine calibration information for correcting measurements of focus error. A method is exemplified by the flow chart of FIG. 14 for a case where measurements of focus error are corrected In steps S11 and S13, metrology measurements are performed on a target that comprises a first periodic structure 32 and a second periodic structure 33. The substrate is rotated by the predetermined angle (e.g. 90 degrees) in step S12, in between steps S11 and S13. Calibration data units obtained from steps S11 and S13 are used to obtain calibration information in the form of correction factors in step S14. The target may for example take the form shown in FIGS. 11 and 12 described above. The first periodic structure 32 is orientated at the predetermined angle (e.g. 90 degrees) relative to the second periodic structure 33. In an embodiment, the first periodic structure 32 and the second periodic structure 33 are gratings having the same pitch.

The method comprises obtaining a first pair of calibration data units. Each calibration data unit represents detected radiation scattered from the target in a metrology process. The target is a structure formed on a substrate using the patterning process. A first calibration data unit of the first pair of calibration data units is obtained with the substrate at a reference angular position (in step S11). A second calibration data unit of the first pair of calibration data units is obtained with the substrate rotated through the predetermined angle (e.g. 90 degrees) away from the reference angular position (in step S13). The first calibration data unit and the second calibration data unit of the first pair of calibration units are obtained from the first periodic structure 32. The first pair of calibration data units are used to obtain first calibration information about the metrology process (in step S14). The first calibration information may comprise a first correction factor.

The method further comprises obtaining a second pair of calibration data units. Each calibration data unit represents detected radiation scattered from the target in the metrology process. A first calibration data unit of the second pair of calibration data units is obtained from the second periodic structure 33 while the substrate is at the reference angular position (in step S11). A second calibration data unit of the second pair of calibration data units is obtained from the second periodic structure 33 while the substrate is at the predetermined angle (e.g. 90 degrees) away from the reference angular position (in step S13). The second pair of calibration data units is used to obtain second calibration information about the metrology process (in step S14). The second calibration information may comprise a second correction factor.

In step S15, a further target is measured to obtain a measurement data unit. The measurement data unit represents detected radiation scattered from the further target. The further target comprises a structure formed using the patterning process on the substrate or on a further substrate. In an embodiment, the further target comprises a first periodic structure 32 and a second periodic structure 33 oriented at the predetermined angle (e.g. 90 degrees) relative to each other. The first periodic structure 32 and the second periodic structure 33 may have the same form (e.g. comprising gratings having the same pitch) as the first periodic structure 32 and the second periodic structure 33 of the target used to obtain the first and second calibration information in step S14. In step S16, a value of a parameter of interest is obtained using the measurement data unit and the first and second calibration information obtained in step S14. In an embodiment, the determination of the parameter of interest comprises determining a focus error. The parameter of interest (e.g. focus error) is determined based on a measurement data unit comprising first data and second data. The first data represents detected radiation scattered from the first periodic structure 32. The second data represents detected radiation scattered from the second periodic structure 33. The determination of the parameter of interest (e.g. focus error) comprises applying the first correction factor to the first data and applying the second correction factor to the second data.

In an embodiment, the first data represents a first sum of intensities from +1 and −1 diffraction orders of radiation from the first periodic structure 32. The second data represents a second sum of intensities from +1 and −1 diffraction orders of radiation from the second periodic structure 33. The first data and the second data may be obtained using a dark field imaging mode. The determination of the parameter of interest (e.g. focus error) comprises determining a difference between the first sum and the second sum after application of the correction factors to the first data and the second data.

The above approach is particularly effective for determining focus error because it has been found that periodic structures oriented differently relative to each other (e.g. at 90 degrees relative to each other) and having the same pitch (like the first periodic structure 32 and the second periodic structure 33) respond differently to certain types of aberration (e.g. aberrations proportional to astigmatism, such as Z5). This results in the difference between a sum of the +1 and −1 diffraction orders from one of the periodic structures (e.g. the first periodic structure 32) and a sum of the +1 and −1 diffraction orders from the other one of the periodic structures (e.g. the second periodic structure 33) being correlated with (e.g. varying monotonically with) the focus of the lithographic apparatus used to form the periodic structures. A calibration curve can thus be derived to make it possible to derive focus error from measurements of the difference between the two sums of the +1 and −1 diffraction orders for the different periodic structures. In an embodiment, the method further comprises forming the target and further target using a patterning process with a deliberately applied astigmatism to enhance correlation between focus error and the difference between the first sum and the second sum.

In the absence of the first and second correction factors, the measured first sum and second sum would be affected by sensor asymmetry caused by lenses and other optical components of the metrology apparatus. Since the first periodic structure 32 and the second periodic structure 33 scatter radiation in different directions (orthogonal to the orientations of the periodic structures), the radiation will pass along different optical paths in the metrology apparatus. The measured +1 and −1 diffraction orders for the first periodic structure 32 will thus be affected by different sensor asymmetries than the measured +1 and −1 diffraction orders for the second periodic structure 33. As a result, the difference between the first sum and the second sum will be affected by the sensor asymmetry, which may be different for different metrology apparatuses.

In the case where the predetermined angle is 90 degrees, the approach described above with reference to FIG. 14 exploits the fact that rotation of the substrate by 90 degrees cause the first periodic structure 32 and the second periodic structure 33 to rotate into each other's orientation (e.g. horizontal becomes vertical and vertical becomes horizontal). Scattered radiation from one of the periodic structures with the substrate at 90 degrees will thus follow the same optical path as scattered radiation from the other periodic structure with the substrate at 0 degrees. If the first and second correction factors are respectively labelled $\omega_V$ (where an orientation of the first periodic structure is considered "vertical") and $\omega_H$ (where an orientation of the second periodic structure is considered "horizontal"), expressions for them can be written as follows:

$$\omega_V = \frac{I_{V0} - I_{V90}}{I_{V0} + I_{V90}} \text{ and } \omega_H = \frac{I_{H0} - I_{H90}}{I_{H0} + I_{H90}}$$

where $I_{V0}$ is the total diffracted intensity (of the first order components) from the first periodic structure 32 at 0 degrees substrate rotation, $I_{V90}$ is the diffracted intensity (of the first order components) from the first periodic structure 32 at 90 degrees substrate rotation, $I_{H0}$ is the diffracted intensity (of the first order components) from the second periodic structure 33 at 0 degrees substrate rotation, and $I_{H90}$ is the diffracted intensity (of the first order components) from the second periodic structure 33 at 90 degrees substrate rotation.

A corrected value of the diffracted intensity from the first periodic structure 32, $I_V^{corr}$, is given by the following expression:

$$I_V^{corr} = \frac{I_{V0}}{1 + \omega_V}$$

A corrected value of the diffracted intensity from the second periodic structure 33, $I_H^{corr}$, is given by the following expression:

$$I_H^{corr} = \frac{I_{H0}}{1 + \omega_H}$$

The above method allows focus error to be measured accurately and reliably, with minimal variation between different metrology apparatuses and without requiring measurements to be performed at multiple rotational positions of the substrate (except initially to obtain the first and second correction factors).

In an embodiment, a calibration information unit (e.g. a value of the polarization imbalance $\theta$ for a particular subset of metrology process settings) is obtained for each of at least one pair of calibration data units 60 at each of at least two different reference angular positions. In an embodiment, the different reference angular positions comprise at least two angular positions separated from each other by 180 degrees. Thus, for example, a first calibration information unit may be obtained using a pair of calibration data units 60 obtained with the substrate W at 0 degrees and 90 degrees and a second calibration information unit may be obtained using a pair of calibration data units 60 obtained with the substrate W at 180 degrees and 270 degrees. As described below, calibration data units 60 obtained at angular positions of the substrate W that are separated from each other by 180 degrees may also be used to derive information about the sensor asymmetry $\delta$.

Although examples described herein refer to example angular positions of the substrate W and polarization directions that are multiples of 90 degrees, a value of the polarization imbalance $\theta$ can be derived from the same measurements (using trigonometry) for any angle of polarization in the incident radiation channel and any angle of polarization in the detected radiation channel.

In an embodiment, a calibration information unit (e.g. a value of the polarization imbalance $\theta$) is obtained for each of plural pairs of calibration data units 60 that are each obtained using a periodic structure 32-35 with a different respective bias (e.g. +d or –d). As described above, each bias may represent a deliberately applied nominal shift between different layers of the periodic structure 32-35 (e.g. +d or –d).

In an embodiment, the calibration information units (e.g. values of the polarization imbalance $\theta$) are averaged over different values of metrology process settings. For example, the calibration information units may be averaged over different biases and/or different reference angular positions of the substrate W. This averaging may reduce negative effects caused by unwanted inhomogeneity in the radiation spot used to illuminate the target T during the metrology process.

In an embodiment, calibration data units 60 are obtained for each of plural different orientations of the target T, for example with a periodicity of a periodic structure 32-35 in the target T being parallel to X for one orientation of the target T, and with a periodicity of the same periodic structure 32-25 in the target T parallel to Y for another orientation of the target T. At least one separate calibration information unit (e.g. a value of the polarization imbalance $\theta$) is obtained for each of the different orientations.

In an embodiment, calibration data units 60 are obtained for each of plural different diffraction orders of the radiation scattered from the target T, for example +1 diffraction order and –1 diffraction order. At least one separate calibration information unit (e.g. a value of the polarization imbalance $\theta$) is obtained for each of the different diffraction orders.

In an embodiment, calibration data units 60 are obtained for each of plural different polarization settings relative to the target, for example: 1) with incident and detected radiation being co-polarized and parallel to a direction of periodicity of a periodic structure in the target T; 2) with incident and detected radiation being cross-polarized and the incident radiation polarized parallel to the direction of periodicity of the periodic structure in the target T; 3) with incident and detected radiation being cross-polarized and the detected radiation being polarized parallel to the direction of periodicity of the periodic structure in the target T; and 4) with incident and detected radiation being co-polarized orthogonally to the direction of periodicity of the periodic structure in the target T. In an embodiment, at least one separate calibration information unit (e.g. a value of the polarization imbalance $\theta$) is obtained for each of the different polarization settings relative to the target T.

In an embodiment, the determination of the value of the parameter of interest from the measurement data unit in step S5 comprises selecting one or more of the separate calibration information units (e.g. one or more of the values of polarization imbalance $\theta$) according to the configuration of the metrology process used to obtain the measurement data unit (e.g. so that the selected calibration information unit appropriately represents the conditions under which the measurement data unit was obtained and therefore optimally corrects for errors such as polarization imbalance $\theta$ and/or sensor asymmetry $\delta$).

Similar approaches to those discussed above in relation to the polarization imbalance $\theta$ can be used to obtain values for the sensor asymmetry $\delta$. In this case, solving for $\delta$ may be achieved by deriving a normalized difference between measured intensities of the target after 180 degrees of substrate rotation in a target of the type depicted in FIG. 4 (with four periodic structures 32-35). This can be expressed for general metrology settings as follows:

$$\delta = \frac{{}^{SiteN}_{HV} I^{\pm1}_{WR} - {}^{SiteN+2}_{HV} I^{\mp1}_{WR+180}}{{}^{SiteN}_{HV} I^{\pm1}_{WR} + {}^{Site+2}_{HV} I^{\mp1}_{WR+180}}$$

where "HV" signifies that the polarization settings between the two obtained intensities are always the same (e.g. H/H and H/H, H/V and H/V, V/H and V/H or V/V and V/V), "SiteN" and "SiteN+2" indicates that account is taken of the changing of a position of a periodic structure 32-35 due to the rotation of the substrate W, "WR" represents a reference angular position of the substrate and "WR+180" represents the reference angular position+180 degrees rotation, and "±1" and "∓1" signifies that the diffraction orders of the two obtained intensities are always opposite (e.g. +1 and −1 or −1 and +1).

An example implementation of the above equation is described by the following equation:

$$_{co,pol0}^{x+}\delta_{WR0} = \frac{{}^{Site1}_{H/H} I^{+1}_{WR0} - {}^{Site3}_{H/H} I^{-1}_{WR180}}{{}^{Site1}_{H/H} I^{+1}_{WR0} + {}^{Site3}_{H/H} I^{-1}_{WR180}}$$

where $_{co,pol0}^{x+}\delta^{WR0}$ represents the value of $\delta$ corresponding to the combination of metrology process settings in which a positively biased X direction periodic structure is measured using a polarization setting in which the incident and detected radiation channels are co-polarized and at 0 degrees relative to a direction of periodicity of the periodic structure.

In an embodiment, 32 separate solutions can be found for $\delta$ covering: 2 directions of the periodic structure (e.g. parallel to X and Y), 2 biases (e.g. +d and −d), 4 polarization settings relative to the target, and 2 reference angular positions of the substrate (e.g. 0 and 90 degrees). Averaging can be performed over the different biases and/or reference angular positions to reduce the effects of spot inhomogeneity and improve accuracy. In other embodiments, fewer or more separate solutions for δ may be possible, depending on the number of degrees of freedom available. For example, if more than 4 polarization settings are possible (e.g. where a larger number of different polarization directions are available), a correspondingly larger number of separate solutions for δ will be possible.

Properties of the patterning process may vary over time, leading to changes in imperfections such as polarization imbalance θ and/or sensor asymmetry δ. Such drifts may arise, for example, due to changes in temperature of optical components of the lithography apparatus LA. For example, absorption of radiation in the objective lens may cause heating and stress-induced birefringence.

Frequent updating of calibration information, for example to repeatedly update values for the polarization imbalance θ and/or sensor asymmetry δ, could reduce the effect of drift, but the time lost in making the necessary measurements would negatively affect throughput. Embodiments described below provide ways of reducing the effect of drift while allowing throughout to be maintained at an acceptable level.

Figure 15:
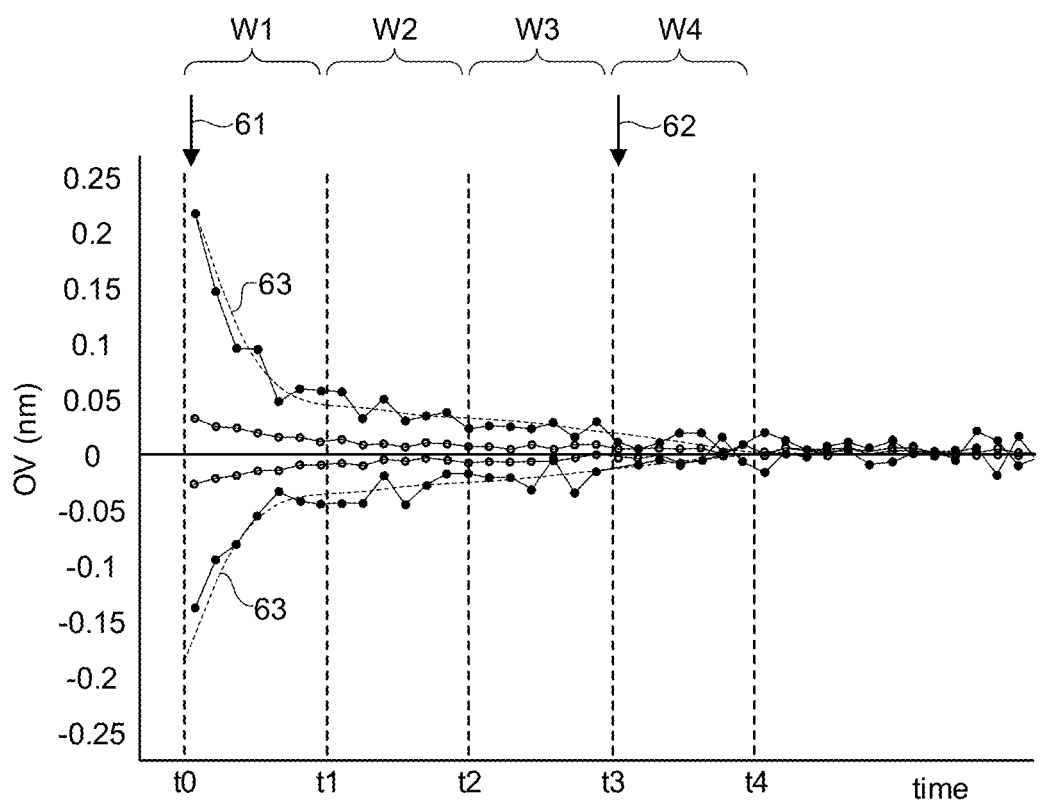
FIG. 15 is a graph depicting simulated measurements of four substrates in sequence to illustrate a method of determining a value of a parameter of interest for multiple targets using measurements on a fiducial target to take account of drift.

FIG. 15 is a graph depicting simulated measurements on a set (lot) of four substrates W1-W4 to illustrate an example approach. In this embodiment, measurements are performed over a measurement time window from t0 to t4. Targets on substrate W1 are measured between t0 and t1, targets on substrate W2 are measured between t1 and t2, targets on substrate W3 are measured between t2 and t3, and targets on substrate W4 are measured between t3 and t4. The vertical axis represents measured drift of overlay OV, which is an example of a parameter of interest that may drift as a function of time. The horizontal axis represents time, with the measurement time window extending over about 80 minutes in the example shown. Solid circles represent measurements performed on targets having a relative low stack sensitivity. Open circles represent measurements performed on targets having a higher stack sensitivity. The graphs above and below the horizontal line of overlay OV=0 correspond respectively to measurements performed on substrates at rotational positions of 0 and 180 degrees. It can be seen that the overlay OV varies significantly as a function of time over the measurement time window, with a maximum deviation of about 0.2 nm in this example.

Figure 16:
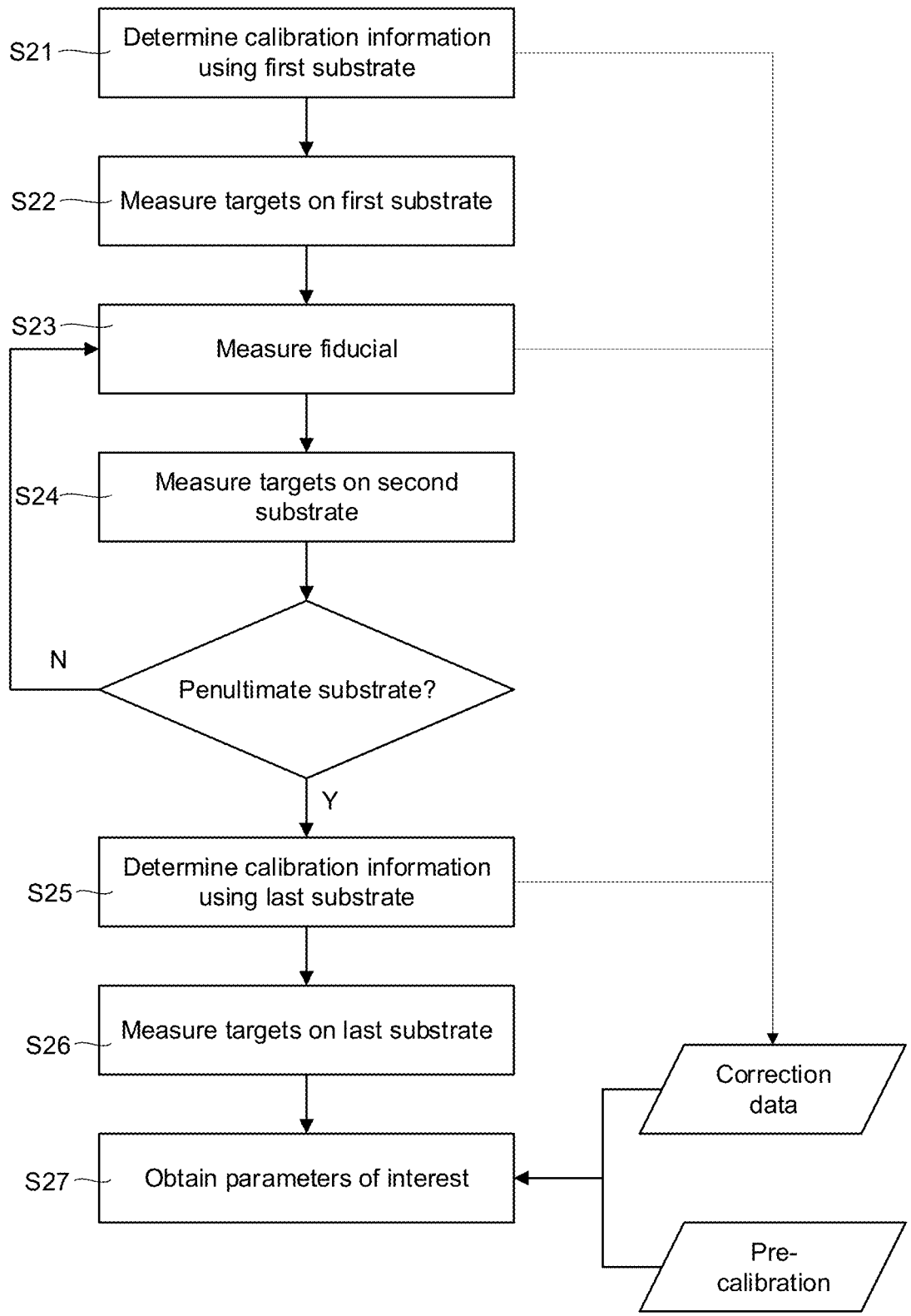
FIG. 16 is a flow chart depicting an example method of the type shown in FIG. 15.
Figure 17:
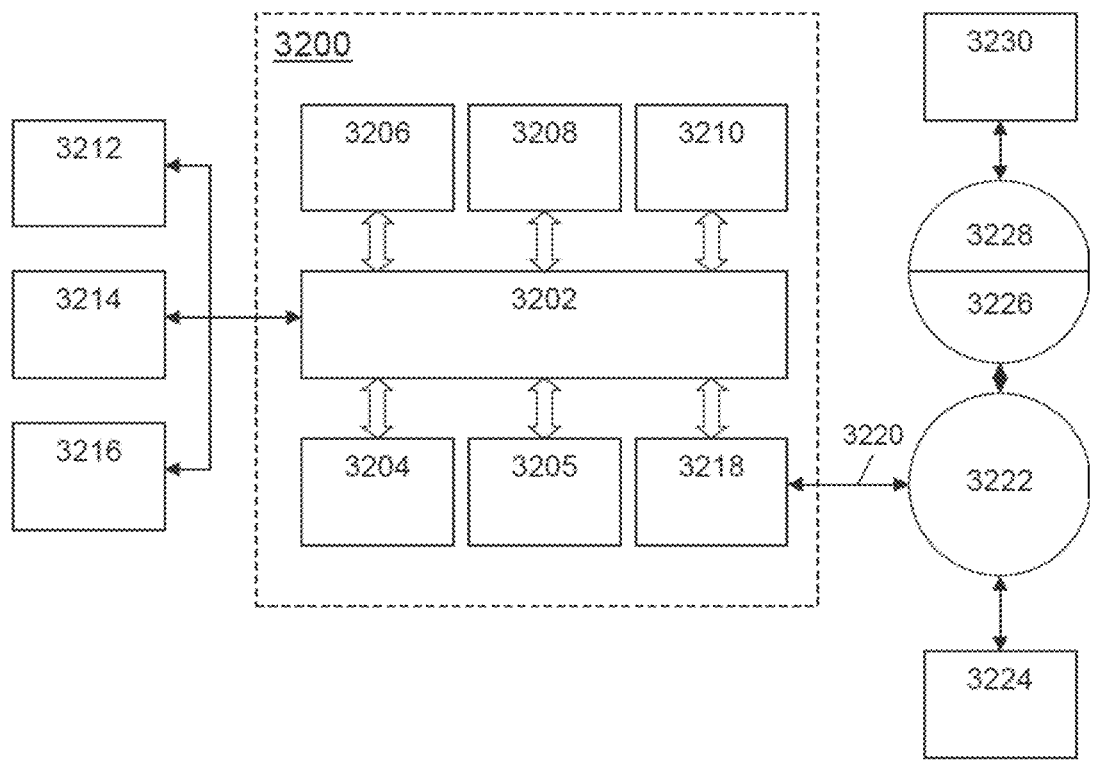
FIG. 17 schematically depicts a computer system which may implement embodiments of this disclosure.

FIG. 16 is a flow chart depicting an example method of determining a value of a parameter of interest while taking account of drift. The method is applicable to measurements on multiple targets and multiple substrates over an extended period of time, as depicted in FIG. 15.

In step S21, calibration information is obtained from a target. The calibration information may comprise information about polarization imbalance θ and/or sensor asymmetry δ and may be obtained using any of the approaches described above (e.g. by performing steps S0-S2 or S0-S3 described above with reference to FIG. 11), or other approaches. In the example depicted in FIG. 15, the calibration information may be obtained from measurements performed at time point 61, shortly after t0. The measurements may be performed as described above with reference to step S0 of FIG. 11, for example.

From step S22 onwards in FIG. 16, the method further comprises obtaining a measurement data unit (representing detected radiation scattered from the target) for each of N further targets during the measurement time period (depicted as solid and open circles in FIG. 15). The obtaining of the measurement data unit for each further target may be performed using any of the approaches described above (e.g. as described with reference to step S4 of FIG. 11), or other approaches. The method further comprises obtaining a measurement data unit at M different times during the measurement time period for a single fixed fiducial target. M is typically less than N. In an embodiment, the measurement data unit for the fiducial target is obtained once per substrate being processed. In the example of FIG. 15, the measurement data unit for the fiducial target may be obtained once per substrate being processed, for example at the beginning of measurement of that substrate (e.g. shortly after times t1, t2, t3 and t4). The fiducial target is desirably configured to be as similar as possible to (e.g. having the same pitch as) the N further targets and is desirably measured using the same optical settings (e.g. at the same wavelength) as the N further targets. The value of the parameter of interest (e.g. overlay) is determined for each of one or more of the further targets using the measurement data unit obtained for the target, the obtained calibration information, and the measurement data obtained from one or more of the measurements of the fiducial target. The measurement data unit provides nominal information about the value of the parameter of interest. The calibration information provides a first level of correction of the value of the parameter of interest. The one or more measurements of the fiducial target allow the correction provided by the calibration information to be improved by taking account of drift. The one or more measurements of the fiducial target are expected to correlate with drift because the properties of the fiducial target are expected to remain constant over time.

Following the example flow of FIG. 16, in step S22 the obtaining of the measurement data unit is performed for each of the further targets on a first substrate W1. In step S23, subsequent to step S22, the measurement data unit is obtained for the fiducial target (e.g. at t1 in FIG. 15). In step S24, subsequent to step S23, the obtaining of the measurement data unit is performed for each of the further targets on a second substrate W2. Steps S23 and S24 are repeated until the penultimate substrate W3 of the lot is processed, which in the present example is substrate W3. In this example, the further targets of substrates W2 and W3 are thus measured with the fiducial target being measured in between at t2. In this embodiment, the method then continues to step S25, where calibration information is obtained from a target on the last substrate W4. The calibration information may comprise information about polarization imbalance θ and/or sensor asymmetry δ and may be obtained using any of the approaches described above (e.g. by performing steps S0-S2 or S0-S3 as described above with reference to FIG. 11), or other approaches. In the example depicted in FIG. 15, the calibration information is obtained from measurements (e.g. as described above with reference to step S0 of FIG. 11) performed at time point 62, shortly after t3. In step S26, subsequent to step S25, the obtaining of the measurement data unit for the further targets is performed for the further targets of a last substrate W4. In step S27, the value of the parameter of interest is determined for each of one or more of the further targets using the measurement data unit obtained for the target, the obtained calibration information, and the measurement data obtained from one or more of the measurements of the fiducial target. In the example shown, the method may involve repeating the step of obtaining a plurality of calibration data units (to obtain the calibration information) at least once during the measurement time period (e.g. at time point 62) to obtain updated calibration information. The determination of the value of the parameter of interest in step S27 for one or more of the further targets may then be performed using the updated calibration information.

The measurements on the fiducial target and the calibration information (e.g. as obtained using measurements at time points 61 and 62) allow drift in the patterning process to be taken account of efficiently with minimal loss of throughput. The information provided by the measurements on the fiducial target and the calibration information may be used in various ways. In some embodiments, the measurements on the fiducial target and the calibration information provide correction data that can be applied to correct nominal values of the parameter of interest (e.g. overlay). The correction data may comprise information about an expected drift in properties such as polarization imbalance θ and/or sensor asymmetry δ as a function of time. The calibration information obtained at time point 61 provides an initial value of the polarization imbalance θ and/or sensor asymmetry δ and the measurements on the fiducial target then provide information about how the polarization imbalance θ and/or sensor asymmetry δ change over time. Alternatively or additionally, as depicted in FIG. 15, the correction data may be provided as a predicted curve 63 (see FIG. 15) of an apparent drift of a contribution to a measured value of the parameter of interest (e.g. a drift in a contribution to overlay OV) from drifts in one or more properties of the patterning process. Here, an initial value of the drift may be determined from the calibration information obtained at point 61 (e.g. via a determination of the polarization imbalance θ and/or sensor asymmetry δ) and the subsequent measurements on the fiducial target provide information about how the drift is expected to vary as a function of time. The subsequent measurements on the fiducial target provide information about the expected form of the curve 63. In embodiments where the calibration information is obtained at two time points, for example for a first substrate W1 and a last substrate W4 of a substrate lot (e.g. at time points 61 and 62 in FIG. 15), the measurements on the fiducial target may be used to interpolate between the calibration information obtained at the two time points and/or to extrapolate beyond one or both of the time points (e.g. beyond time point 62 in FIG. 15 to correct measurements of the further targets of the last substrate W4). The determination of the value of the parameter of interest for each of the further targets may comprise calculating the parameter of interest in the usual way and then applying a correction from the correction data to obtain an improved value of the parameter of interest. A separate individualized correction may be applied for each further target.

The above methods use measurements on a fiducial target to monitor drift in properties such as polarization imbalance θ and/or sensor asymmetry δ, for example by interpolation and/or extrapolation based on calibration information obtained at one or more points in time. In an alternative approach, the interpolation and/or extrapolation may be replaced by determining how the calibration information correlates with one or more other parameters of the lithographic apparatus or targets that could be measured and used to update the calibration information to take account of drift.

As an alternative, or in addition, to the methods for correcting for drift described above, one or more pre-calibration curves may be derived and used to at least partially correct for drift. The pre-calibration curves may be derived by computational modelling or calibration measurements and may take account of the influence on polarization imbalance θ and/or sensor asymmetry δ of various factors, including one or more selected from the following: variation with time only (e.g. in a scenario where the lithography apparatus LA is idle); variation with input air temperature (e.g. as obtained via one or more sensors); and/or variation with objective lens temperature (e.g. as obtained via one or more sensors).

Referring to FIG. 16, a computer system 3200 is shown. The computer system 3200 includes a bus 3202 or other communication mechanism for communicating information, and a processor 3204 (or multiple processors 3204 and 3205) coupled with bus 3202 for processing information. Computer system 3200 also includes a main memory 3206, such as a random access memory (RAM) or other dynamic storage device, coupled to bus 3202 for storing information and instructions to be executed by processor 3204. Main memory 3206 also may be used for storing temporary variables or other intermediate information during execution of instructions to be executed by processor 3204. Computer system 3200 further includes a read only memory (ROM) 3208 or other static storage device coupled to bus 3202 for storing static information and instructions for processor 3204. A storage device 3210, such as a magnetic disk or optical disk, is provided and coupled to bus 3202 for storing information and instructions.

Computer system 3200 may be coupled via bus 3202 to a display 3212, such as a cathode ray tube (CRT) or flat panel or touch panel display for displaying information to a computer user. An input device 3214, including alphanumeric and other keys, is coupled to bus 3202 for communicating information and command selections to processor 3204. Another type of user input device is cursor control 3216, such as a mouse, a trackball, or cursor direction keys for communicating direction information and command selections to processor 3204 and for controlling cursor movement on display 3212. This input device typically has two degrees of freedom in two axes, a first axis (e.g., x) and a second axis (e.g., y), that allows the device to specify positions in a plane. A touch panel (screen) display may also be used as an input device.

The computer system 3200 may be suitable to function as a processing unit herein in response to processor 3204 executing one or more sequences of one or more instructions contained in main memory 3206. Such instructions may be read into main memory 3206 from another computer-readable medium, such as storage device 3210. Execution of the sequences of instructions contained in main memory 3206 causes processor 3204 to perform a process described herein. One or more processors in a multi-processing arrangement may also be employed to execute the sequences of instructions contained in main memory 3206. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 3204 for execution. Such a medium may take many forms, including but not limited to, non-volatile media, volatile media, and transmission media. Non-volatile media include, for example, optical or magnetic disks, such as storage device 3210. Volatile media include dynamic memory, such as main memory 3206. Transmission media include coaxial cables, copper wire and fiber optics, including the wires that comprise bus 3202. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 3204 for execution. For example, the instructions may initially be borne on a magnetic disk of a remote computer. The remote computer can load the instructions into its dynamic memory and send the instructions over a telephone line using a modem. A modem local to computer system 3200 can receive the data on the telephone line and use an infrared transmitter to convert the data to an infrared signal. An infrared detector coupled to bus 3202 can receive the data carried in the infrared signal and place the data on bus 3202. Bus 3202 carries the data to main memory 3206, from which processor 3204 retrieves and executes the instructions. The instructions received by main memory 3206 may optionally be stored on storage device 3210 either before or after execution by processor 3204.

Computer system 3200 may also include a communication interface 3218 coupled to bus 3202. Communication interface 3218 provides a two-way data communication coupling to a network link 3220 that is connected to a local network 3222. For example, communication interface 3218 may be an integrated services digital network (ISDN) card or a modem to provide a data communication connection to a corresponding type of telephone line. As another example, communication interface 3218 may be a local area network (LAN) card to provide a data communication connection to a compatible LAN. Wireless links may also be implemented. In any such implementation, communication interface 3218 sends and receives electrical, electromagnetic or optical signals that carry digital data streams representing various types of information.

Network link 3220 typically provides data communication through one or more networks to other data devices. For example, network link 3220 may provide a connection through local network 3222 to a host computer 3224 or to data equipment operated by an Internet Service Provider (ISP) 3226. ISP 3226 in turn provides data communication services through the worldwide packet data communication network, now commonly referred to as the "Internet" 3228. Local network 3222 and Internet 3228 both use electrical, electromagnetic or optical signals that carry digital data streams. The signals through the various networks and the signals on network link 3220 and through communication interface 3218, which carry the digital data to and from computer system 3200, are exemplary forms of carrier waves transporting the information.

Computer system 3200 can send messages and receive data, including program code, through the network(s), network link 3220, and communication interface 3218. In the Internet example, a server 3230 might transmit a requested code for an application program through Internet 3228, ISP 3226, local network 3222 and communication interface 3218. In accordance with one or more embodiments, one such downloaded application provides for a method as disclosed herein, for example. The received code may be executed by processor 3204 as it is received, and/or stored in storage device 3210, or other non-volatile storage for later execution. In this manner, computer system 3200 may obtain application code in the form of a carrier wave.

An embodiment of the disclosure may take the form of a computer program containing one or more sequences of machine-readable instructions describing a method as disclosed herein, or a data storage medium (e.g. semiconductor memory, magnetic or optical disk) having such a computer program stored therein. Further, the machine-readable instruction may be embodied in two or more computer programs. The two or more computer programs may be stored on one or more different memories and/or data storage media.

Further embodiments according to the invention are described in below numbered clauses:

1. A method of determining a value of a parameter of interest of a patterning process, the method comprising:
   obtaining a plurality of calibration data units, each calibration data unit representing detected radiation scattered from a respective target in a metrology process, the target comprising a structure formed on a substrate using the patterning process, wherein each of at least two of the calibration data units represents detected radiation obtained using different respective polarization settings in the metrology process, each polarization setting defining a polarization property of incident radiation of the metrology process and a polarization property of detected radiation of the metrology process;
   using the calibration data units to obtain calibration information about the metrology process;
   obtaining a measurement data unit representing detected radiation scattered from a further target, the further target comprising a structure formed using the patterning process on the substrate or on a further substrate; and
   determining the value of the parameter of interest using the measurement data unit and the obtained calibration information.

2. The method of clause 1, wherein:
   the different polarization settings used to obtain the calibration data units comprise at least a first polarization setting and a second polarization setting; and
   the incident radiation of the first polarization setting is polarized differently to the incident radiation of the second polarization setting.

3. The method of clause 2, wherein the incident radiation of the first polarization setting is polarized orthogonally to the incident radiation of the second polarization setting.

4. The method of clause 2 or clause 3, wherein the detected radiation of the first polarization setting is polarized differently to the detected radiation of the second polarization setting.

5. The method of clause 4, wherein the detected radiation of the first polarization setting is polarized orthogonally to the detected radiation of the second polarization setting.

6. The method of any of clauses 2-5, wherein:
   a calibration information unit is obtained using a pair of calibration data units;
   a first calibration data unit of the pair of calibration data units is obtained with the substrate at a reference angular position using the first polarization setting; and
   a second calibration data unit of the pair of calibration data units is obtained with the substrate rotated through a predetermined angle away from the reference angular position using the second polarization setting.

7. The method of clause 6, wherein the predetermined angle is equal to an angle between a direction of polarization of incident radiation of the first polarization setting and a direction of polarization of incident radiation of the second polarization setting.
8. The method of clause 6 or clause 7, wherein the predetermined angle is equal to an angle between a direction of polarization of detected radiation of the first polarization setting and a direction of polarization of detected radiation of the second polarization setting.
9. The method of any of clauses 6-8, wherein the predetermined angle equals 90 degrees.
10. The method of any of clauses 6-9, wherein a calibration information unit is obtained for each of plural different reference angular positions.
11. The method of clause 10, wherein the different reference angular positions comprise at least two angular positions separated from each other by 180 degrees.
12. The method of any of clauses 6-11, wherein:
   at least a subset of the calibration information units comprises a calibration information unit for each of plural pairs of calibration data units of which each pair is obtained using a periodic structure with a different respective bias relative to each other pair; and
   each bias represents a deliberately applied nominal shift between different layers of the periodic structure.
13. The method of any of clauses 10-12, wherein the obtaining of the calibration information comprises averaging over two or more of the calibration information units.
14. The method of any of clauses 6-13, wherein:
   calibration data units are obtained for each of plural different orientations of the target; and
   at least one separate calibration information unit is obtained for each of the different orientations.
15. The method of any of clauses 6-14, wherein:
   calibration data units are obtained for each of plural different diffraction orders of the radiation scattered from the target; and
   at least one separate calibration information unit is obtained for each of the different diffraction orders.
16. The method of any of clauses 6-15, wherein:
   calibration data units are obtained for each of plural different polarization settings relative to the target; and
   at least one separate calibration information unit is obtained for each of the different polarization settings relative to the target.
17. The method of any of clauses 14-16, wherein the determining of the value of the parameter of interest from the measurement data unit comprises selecting one or more of the separate calibration information units according to the configuration of the metrology process used to obtain the measurement data unit.
18. The method of any preceding clause, wherein each calibration data unit comprises or is derived from:
   a detected radiation intensity in a pupil plane, a detected radiation phase in a pupil plane, a detected radiation intensity distribution in a pupil plane, or a detected radiation phase distribution in a pupil plane; or
   a detected radiation intensity in an image plane, a detected radiation phase in an image plane, a detected radiation intensity distribution in an image plane, or a detected radiation phase distribution in an image plane.
19. The method of any preceding clause, wherein each measurement data unit comprises or is derived from:
   a detected radiation intensity in a pupil plane, a detected radiation phase in a pupil plane, a detected radiation intensity distribution in a pupil plane, or a detected radiation phase distribution in a pupil plane; or
   a detected radiation intensity in an image plane, a detected radiation phase in an image plane, a detected radiation intensity distribution in an image plane, or a detected radiation phase distribution in an image plane.
20. The method of any preceding clause, wherein:
   the obtaining a measurement data unit is performed for each of N further targets during a measurement time period;
   the step of obtaining a measurement data unit is further performed at M different times during the measurement time period for a single fixed fiducial target, where M is less than N; and
   the value of the parameter of interest is determined for each of one or more of the further targets using the measurement data unit obtained for the target, the obtained calibration information, and the measurement data obtained from one or more of the measurements of the fiducial target.
21. The method of clause 20, further comprising repeating the step of obtaining a plurality of calibration data units at least once during the measurement time period to obtain updated calibration information, wherein:
   the determination of the value of the parameter of interest for one or more of the further targets is performed using the updated calibration information.
22. The method of any preceding clause, wherein the structure comprises a multilayered structure and the parameter of interest comprises an overlay error between two or more different layers in the multilayer structure.
23. The method of any preceding clause, wherein the parameter of interest comprises a focus error or critical dimension.
24. A method of determining a value of a parameter of interest of a patterning process, comprising:
   obtaining a first pair of calibration data units, each calibration data unit representing detected radiation scattered from a target in a metrology process, the target comprising a structure formed on a substrate using the patterning process, wherein a first calibration data unit of the first pair of calibration data units is obtained with the substrate at a reference angular position, and a second calibration data unit of the first pair of calibration data units is obtained with the substrate rotated through a predetermined angle away from the reference angular position;
   using the first pair of calibration data units to obtain first calibration information about the metrology process;
   obtaining a measurement data unit representing detected radiation scattered from a further target, the further target comprising a structure formed using the patterning process on the substrate or on a further substrate; and
   determining the value of the parameter of interest using the measurement data unit and the obtained first calibration information.

25. The method of clause 24, wherein:
   the first calibration data unit is obtained using a first polarization setting in the metrology process;
   the second calibration data unit is obtained using a second polarization setting in the metrology process, different from the first polarization setting;
   each polarization setting defines a polarization property of incident radiation of the metrology process and a polarization property of detected radiation of the metrology process; and either or both of the following is satisfied:
   an angle between a direction of polarization of incident radiation of the first polarization setting and a direction of polarization of incident radiation of the second polarization setting is equal to the predetermined angle; and
   an angle between a direction of polarization of detected radiation of the first polarization setting and a direction of polarization of detected radiation of the second polarization setting is equal to the predetermined angle.

26. The method of clause 24 or clause 25, wherein:
   the target comprises a first periodic structure and a second periodic structure, the first periodic structure being orientated at the predetermined angle relative to the second periodic structure; and
   the first calibration data unit and the second calibration data unit of the first pair of calibration units are obtained from the first periodic structure.

27. The method of clause 26, further comprising:
   obtaining a second pair of calibration data units, each calibration data unit representing detected radiation scattered from the target in the metrology process, wherein a first calibration data unit of the second pair of calibration data units is obtained from the second periodic structure while the substrate is at the reference angular position and a second calibration data unit of the second pair of calibration data units is obtained from the second periodic structure while the substrate is at the predetermined angle away from the reference angular position; and
   the second pair of calibration data units is used to obtain second calibration information about the metrology process.

28. The method of clause 27, wherein:
   the further target comprises a first periodic structure and a second periodic structure oriented at the predetermined angle relative to each other;
   the determination of the parameter of interest uses a measurement data unit comprising first data representing detected radiation scattered from the first periodic structure and second data representing detected radiation scattered from the second periodic structure; and
   the determination of the parameter of interest comprises applying a correction factor to the first data based on the first calibration information and applying a correction factor to the second data based on the second calibration information.

29. The method of clause 28, wherein:
   the first data represents a first sum of intensities from +1 and −1 diffraction orders of radiation from the first periodic structure;
   the second data represents a second sum of intensities from +1 and −1 diffraction orders of radiation from the second periodic structure; and
   the determination of the parameter of interest comprises determining a difference between the first sum and the second sum after application of the correction factors to the first data and the second data.

30. The method of any of clauses 24-29, wherein the parameter of interest comprises focus error.

31. The method of clause 30, wherein the target and the further target are formed using a patterning process with a deliberately applied astigmatism to enhance correlation between the focus error and the difference between the first sum and the second sum.

32. The method of any of clauses 24-31, wherein the predetermined angle is 90 degrees.

33. A device manufacturing method, comprising:
   using a patterning process to form a structure on a substrate, wherein the patterning process forms part of a lithographic manufacturing process;
   performing the method of any preceding clause to determine a value of a parameter of interest of the patterning process; and
   adjusting the patterning process based on the determined value of the parameter of interest.

Although specific reference may be made in this text to the use of a metrology apparatus in the manufacture of ICs, it should be understood that the metrology apparatus and processes described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or one or more various other tools. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example nanoimprint lithography, and where the context allows, is not limited to optical lithography. In the case of nanoimprint lithography, the patterning device is an imprint template or mold.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

References herein to correcting or corrections of an error include eliminating the error or reducing the error to within a tolerance range.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The descriptions above are intended to be illustrative, not limiting. Thus, it will be apparent to one skilled in the art that modifications may be made to the disclosure as described without departing from the scope of the claims set out below.

The invention claimed is:

1. A method comprising:
    obtaining a plurality of calibration data sets, each calibration data set representing detected radiation scattered from a respective target in a metrology process, the target comprising a structure formed on a substrate using the patterning process, wherein each of at least two of the calibration data sets represents detected radiation obtained using different respective polarization settings in the metrology process, each polarization setting defining a polarization property of incident radiation of the metrology process and a polarization property of detected radiation of the metrology process;
    using the calibration data sets to calculate calibration information about the metrology process;
    obtaining a measurement data set representing detected radiation scattered from a further target, the further target comprising a structure formed using the patterning process on the substrate or on a further substrate; and
    determining a value of a parameter of interest using the measurement data set and the obtained calibration information.

2. The method of claim 1, wherein:
    the different polarization settings used to obtain the calibration data sets comprise at least a first polarization setting and a second polarization setting; and
    the incident radiation of the first polarization setting is polarized differently to the incident radiation of the second polarization setting.

3. The method of claim 2, wherein the incident radiation of the first polarization setting is polarized orthogonally to the incident radiation of the second polarization setting.

4. The method of claim 2, wherein the detected radiation of the first polarization setting is polarized differently to the detected radiation of the second polarization setting.

5. The method of claim 4, wherein the detected radiation of the first polarization setting is polarized orthogonally to the detected radiation of the second polarization setting.

6. The method of claim 2, further comprising:
    obtaining a calibration information set using a pair of calibration data sets,
    wherein a first calibration data set of the pair of calibration data sets is obtained with the substrate at a reference angular position using the first polarization setting, and
    wherein a second calibration data set of the pair of calibration data sets is obtained with the substrate rotated through a certain angle away from the reference angular position using the second polarization setting.

7. The method of claim 6, wherein the certain angle is equal to an angle between a direction of polarization of incident radiation of the first polarization setting and a direction of polarization of incident radiation of the second polarization setting.

8. The method of claim 6, wherein the certain angle is equal to an angle between a direction of polarization of detected radiation of the first polarization setting and a direction of polarization of detected radiation of the second polarization setting.

9. The method of claim 6, wherein the certain angle equals 90 degrees.

10. The method of claim 6, wherein a calibration information set is obtained for each reference angular position of a plurality of different reference angular positions.

11. The method of claim 10, wherein the different reference angular positions comprise at least two angular positions separated from each other by 180 degrees.

12. The method of claim 10, wherein the obtaining of the calibration information comprises averaging over two or more of the calibration information sets.

13. The method of claim 6, wherein at least a subset of the calibration information sets comprises a calibration information set for each pair of calibration data sets of a plurality of pairs of calibration data sets of which each pair is obtained using a periodic structure with a different respective bias relative to each other pair, wherein each bias represents a deliberately applied nominal shift between different layers of the periodic structure.

14. The method of claim 6, wherein:
calibration data sets are obtained for each orientation of a plurality of different orientations of the target; and
at least one separate calibration information set is obtained for each of the different orientations.

15. A device manufacturing method, comprising:
using a patterning process to form a structure on a substrate, wherein the patterning process forms part of a lithographic manufacturing process;
performing the method of claim 1 to determine a value of a parameter of interest of the patterning process; and
adjusting the patterning process based on the determined value of the parameter of interest.

16. A non-transitory computer-readable medium comprising instructions therein, the instructions, upon execution by a computer system, configured to cause the computer system to at least:
obtain a plurality of calibration data sets, each calibration data set representing detected radiation scattered from a respective target in a metrology process, the target comprising a structure formed on a substrate using the patterning process, wherein each of at least two of the calibration data sets represents detected radiation obtained using different respective polarization settings in the metrology process, each polarization setting defining a polarization property of incident radiation of the metrology process and a polarization property of detected radiation of the metrology process;
use, by a hardware computer system, the calibration data sets to calculate calibration information about the metrology process;
obtain a measurement data set representing detected radiation scattered from a further target, the further target comprising a structure formed using the patterning process on the substrate or on a further substrate; and
determine a value of a parameter of interest using the measurement data set and the obtained calibration information.

17. The computer-readable medium of claim 16, wherein:
the different polarization settings used to obtain the calibration data sets comprise at least a first polarization setting and a second polarization setting; and
the incident radiation of the first polarization setting is polarized differently to the incident radiation of the second polarization setting.

18. The computer-readable medium of claim 16, wherein the instructions are further configured to cause the computer system to obtain a calibration information set using a pair of calibration data sets,
wherein a first calibration data set of the pair of calibration data sets is obtained with the substrate at a reference angular position using the first polarization setting, and
wherein a second calibration data set of the pair of calibration data sets is obtained with the substrate rotated through a certain angle away from the reference angular position using the second polarization setting.

19. The computer-readable medium of claim 16, wherein at least a subset of the calibration information sets comprises a calibration information set for each pair of calibration data sets of a plurality of pairs of calibration data sets of which each pair is obtained using a periodic structure with a different respective bias relative to each other pair, wherein each bias represents a deliberately applied nominal shift between different layers of the periodic structure.

20. The computer-readable medium of claim 16, wherein:
calibration data sets are obtained for each orientation of a plurality of different orientations of the target; and
at least one separate calibration information set is obtained for each of the different orientations.

* * * * *